(12) United States Patent
Kitagawa et al.

(10) Patent No.: US 9,111,810 B2
(45) Date of Patent: Aug. 18, 2015

(54) CIRCUIT BOARD AND DISPLAY DEVICE INCLUDING FIRST AND SECOND CHANNEL LAYERS MADE OF DIFFERENT SEMICONDUCTOR MATERIALS

(75) Inventors: Hideki Kitagawa, Osaka (JP); Shinya Tanaka, Osaka (JP); Hajime Imai, Osaka (JP); Atsuhito Murai, Osaka (JP); Mitsunori Imade, Osaka (JP); Tetsuo Kikuchi, Osaka (JP); Kazunori Morimoto, Osaka (JP); Junya Shimada, Osaka (JP); Jun Nishimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/643,652

(22) PCT Filed: Mar. 2, 2011

(86) PCT No.: PCT/JP2011/054796
§ 371 (c)(1),
(2), (4) Date: Dec. 5, 2012

(87) PCT Pub. No.: WO2011/135920
PCT Pub. Date: Nov. 3, 2011

(65) Prior Publication Data
US 2013/0146866 A1    Jun. 13, 2013

(30) Foreign Application Priority Data

Apr. 30, 2010   (JP) ................................. 2010-105660

(51) Int. Cl.
*H01L 29/10*   (2006.01)
*H01L 29/12*   (2006.01)
(Continued)

(52) U.S. Cl.
CPC ........ *H01L 27/1251* (2013.01); *H01L 27/1225* (2013.01); *H01L 27/1259* (2013.01); *H01L 27/1446* (2013.01); *H01L 27/14632* (2013.01); *H01L 27/14678* (2013.01)

(58) Field of Classification Search
None
See application file for complete search history.

(56) References Cited

U.S. PATENT DOCUMENTS

2002/0048829 A1*  4/2002  Yamazaki et al. ............... 438/16
2004/0032630 A1*  2/2004  Aoki et al. ...................... 359/202
(Continued)

FOREIGN PATENT DOCUMENTS

JP     64-068731 A    3/1989
JP     03-132723 A    6/1991
(Continued)

OTHER PUBLICATIONS

Official Communication issued in International Patent Application No. PCT/JP2011/054796, mailed on May 17, 2011.
(Continued)

*Primary Examiner* — Mamadou Diallo
*Assistant Examiner* — Jay C Chang
(74) *Attorney, Agent, or Firm* — Keating & Bennett, LLP

(57) ABSTRACT

A circuit board (1) includes a plurality of transistor elements on an insulating substrate (2). At least one of the plurality of transistor elements is an oxide TFT (10) including, as a channel layer (11), an oxide semiconductor. At least one of the plurality of transistor elements is an a-SiTFT (20) (i) being different from the oxide TFT (10) in functions as circuit components and (ii) including, as a channel layer (21), an amorphous silicon semiconductor. The oxide TFT (10) is a top gate transistor, and the a-SiTFT (20) is a bottom gate transistor. This provides: a configuration that can (a) enhance the performance of the circuit board equipped with the TFTs differing in their respective functions as circuit components and (b) reduce the area necessary for mounting the TFTs; and a method for producing the circuit board.

9 Claims, 13 Drawing Sheets

(51) Int. Cl.
*H01L 27/12* (2006.01)
*H01L 27/146* (2006.01)
*H01L 27/144* (2006.01)

(56) References Cited

U.S. PATENT DOCUMENTS

| | | |
|---|---|---|
| 2005/0176194 A1 | 8/2005 | Sasaki et al. |
| 2007/0192659 A1* | 8/2007 | Kang et al. .................. 714/726 |
| 2007/0194759 A1* | 8/2007 | Shimizu et al. ............... 320/166 |
| 2009/0146930 A1* | 6/2009 | Nishimura et al. ............. 345/80 |
| 2009/0231021 A1* | 9/2009 | Koyama et al. ............... 327/535 |
| 2009/0242992 A1 | 10/2009 | Kim et al. |
| 2009/0321725 A1 | 12/2009 | Yoshida et al. |
| 2010/0051936 A1* | 3/2010 | Hayashi et al. ................. 257/43 |
| 2010/0065837 A1 | 3/2010 | Omura et al. |
| 2010/0134735 A1 | 6/2010 | Nakamura et al. |
| 2010/0171120 A1* | 7/2010 | Gosain et al. .................. 257/59 |
| 2010/0231562 A1 | 9/2010 | Brown |
| 2010/0237352 A1* | 9/2010 | Sele et al. ...................... 257/66 |
| 2010/0276604 A1* | 11/2010 | Okada ...................... 250/370.09 |

FOREIGN PATENT DOCUMENTS

| | | |
|---|---|---|
| JP | 10-293322 A | 11/1998 |
| JP | 2005-072126 A | 3/2005 |
| JP | 2005-235810 A | 9/2005 |
| JP | 2008-166716 A | 7/2008 |
| JP | 2009-246362 A | 10/2009 |
| JP | 2009-540623 A | 11/2009 |
| JP | 2010-3910 A | 1/2010 |
| JP | 2010-028021 A | 2/2010 |
| WO | 2007/145347 A1 | 12/2007 |
| WO | 2009/025120 A1 | 2/2009 |
| WO | 2011/125353 A1 | 10/2011 |

OTHER PUBLICATIONS

English translation of Official Communication issued in International Patent Application No. PCT/JP2011/054796, mailed on May 17, 2011.

* cited by examiner

F I G. 7
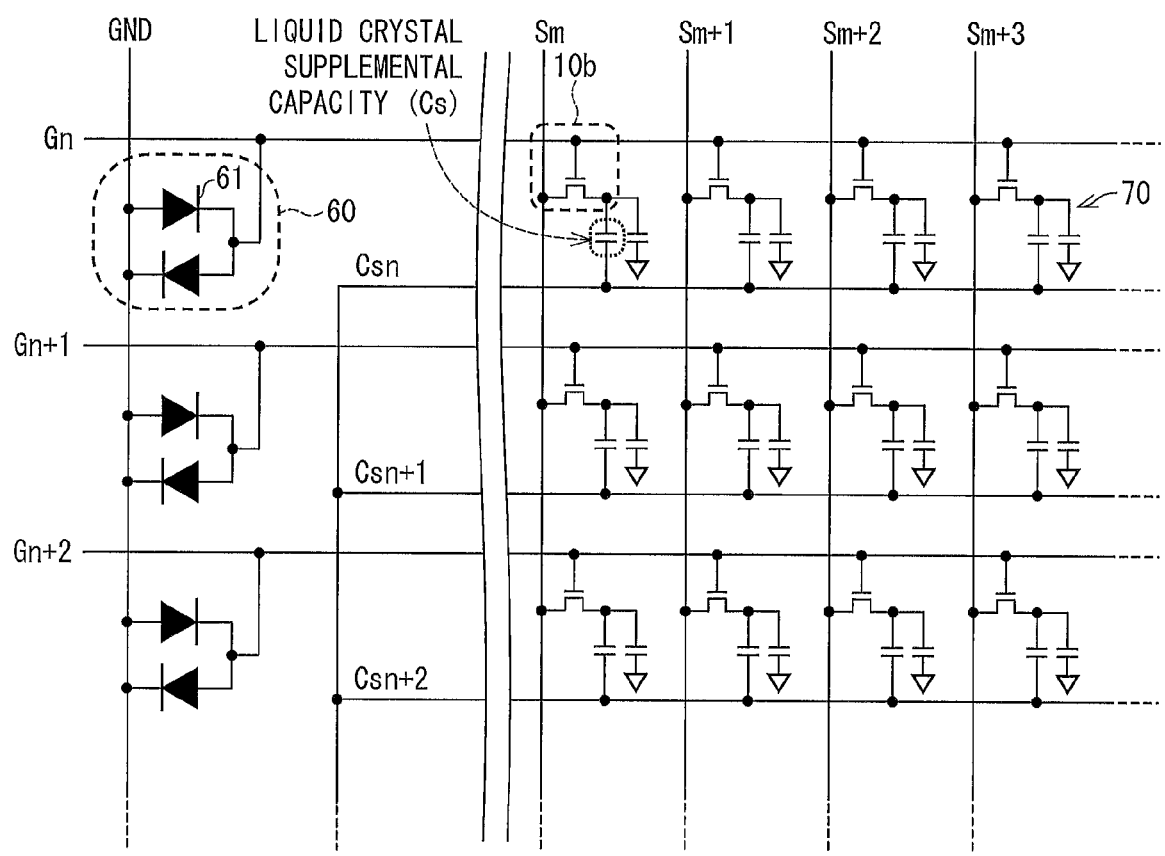

CIRCUIT BOARD AND DISPLAY DEVICE INCLUDING FIRST AND SECOND CHANNEL LAYERS MADE OF DIFFERENT SEMICONDUCTOR MATERIALS

TECHNICAL FIELD

The present invention relates to (i) a circuit board equipped with a thin-film transistor, (ii) a display device including the circuit board, and (iii) a method for producing the circuit board.

BACKGROUND ART

Thin-film transistors (TFT) have been widely used for (i) circuit elements for controlling switching of pixels of liquid crystal display devices (LCDs), (ii) circuit elements for configuring LCD drivers, and (iii) the like. In recent years, there have been demands for improvements in the quality/performance of LCDs such as large screens, high resolutions, and high frame rates. Accordingly, TFTs are increasingly required to deliver high performance and to be highly reliable.

Patent Literature 1 discloses a configuration of a bottom-gate type (inverted staggered type) TFT.

FIG. 14 is a cross-sectional view illustrating the configuration of the conventional bottom-gate type (inverted staggered type) TFT. The TFT has such a configuration that a gate electrode 302 is provided on a substrate 301, and, on top of the substrate 301 and the electrode 302, (i) a first insulating film 303, (ii) an oxide semiconductor 304 as a channel layer, (iii) a second insulating film 305 for serving as an etching-stopping layer, (iv) a source electrode 306, and (v) a drain electrode 307 are provided.

Additionally, in recent years, display devices have been developed, which include optical sensor circuits positioned corresponding to pixels so as to have image-sensing functions as well as image-displaying functions (see Patent Literature 1 for example).

Patent Literature 2 discloses a single-transistor optical sensor circuit.

FIG. 15 is a circuit diagram illustrating a configuration of an image display device including a conventional optical sensor circuit.

As illustrated in FIG. 15, an image display device 110 has display sections 112 and sensor sections 113 both arranged in matrix form. The display sections 112 and sensor sections 113 are defined with signal lines S101, S102, S103, S104 . . . and gate lines G101, G102 . . . , which signal lines and gate lines intersect each other.

The display section 112 is provided with TFTs 114 for driving respective pixels. The sensor section 113 is provided with a diode 115 and with a Tr 116 which is a circuit for amplifying an output from the diode 115. The display section 112 and the sensor section 113 are thus provided with the three types of functionally differing transistors.

A gate electrode 115G of and a source electrode 115S of the diode 115 are connected to a photodiode resetting wire RST. A drain electrode 115D of the diode 115 is connected to a gate electrode 116G of the Tr 116 across the source wire S102, the source wire S103, and an output bus line Vout. A source electrode 116S of the Tr 116 is connected to a power supply bus line Vs. A drain electrode 116D of the Tr 116 is connected to the output bus line Vout which is provided in parallel to the signal line S101.

A terminal 141a, which is one of two terminals of a boost capacitor, is connected to the drain electrode 115D and to the gate electrode 116G. The other terminal 141b of the boost capacitor is connected to an optical sensor line selecting wire RW.

FIG. 16 is a plan view illustrating a circuit board in which each transistor of the image display device 110 is configured in a bottom gate structure.

That is, the TFTs 114, the photodiodes 115, and the Trs 116 are each configured in a bottom gate structure.

In the image display device 110, horizontal lines (i), as a bottom layer, intersect vertical lines (ii) as a top layer, which horizontal lines (i) include gate lines G101, G102 . . . , an optical sensor line selecting wire RW, a photodiode resetting wire RST, and a supplemental capacity wire Cs, and which vertical lines (ii) include signal lines S101, S102, S103, S104, a power supply bus line Vs, and an output bus line Vout.

A gate electrode 115G of the diode 115 is an extending part of the photodiode resetting wire RST, and is connected to a source electrode 115S via a contact hole 117. A drain electrode 115D of the photo diode 115 is provided on the same layer on which the source electrode 115S is provided, and is connected, via a contact hole 118, to an extending part of a terminal 141a which is one of two terminals of a boost capacitor provided on the same layer on which the gate electrode 115G is provided. The terminal 141a (i) intersects, from beneath, the signal line S102, the signal line 103, and the output bus line Vout and (ii) is connected to a gate electrode 116G of the Tr 116.

The terminal 141b, which is the other terminal of the boost capacitor, is provided on the same layer on which the source electrode 115G and the drain electrode 115D are provided. The terminal 141b is connected, via a contact hole 119, to an extending part of the optical sensor line selecting wire RW.

CITATION LIST

Patent Literatures

Patent Literature 1
Japanese Patent Application Publication, Tokukai, No. 2008-166716 A (Publication Date: Jul. 17, 2008)
Patent Literature 2
Japanese Patent Application Publication, PCT International Publication, No. WO2007-145347 (Publication Date: Dec. 21, 2007)
Patent Literature 3
Japanese Patent Application Publication, PCT International Publication, No. WO2009-025120 (Publication Date: Feb. 26, 2009)

SUMMARY OF INVENTION

Technical Problem

The oxide TFT disclosed in Patent Literature 1 has greater mobility than, for example, an amorphous silicon TFT, and the oxide TFT can therefore produce, despite its small size, an output voltage having a sufficiently high SN ratio. Meanwhile, the oxide TFT has a disadvantage in that its sensitivity to light is significantly low.

Not to mention the disclosure of Patent Literature 2, an optical sensor circuit for detecting light includes (i) a TFT for playing a role of a sensor output and (ii) a diode TFT for playing a role of an optical sensor element. Thus, in a case where all of the TFTs are oxide TFTs, the TFTs playing a role of optical sensor elements are significantly low in sensitivity to light (whereas the TFTs playing a role of sensor outputs have no problems at all). Therefore, when all of the TFTs are oxide TFTs the optical sensor circuit can not function sufficiently as an optical sensor circuit.

On the other hand, an amorphous silicon TFT has such an advantage in being highly sensitive to light. However, since the amorphous silicon TFT has lower mobility than an oxide TFT does, the amorphous silicon TFT is required to have a large size in order that an output voltage having a sufficiently high SN ratio may be obtained. Thus, in a case where every TFT in an optical sensor circuit is an amorphous silicon TFT, TFTs playing a role of sensor outputs are inevitably large in size (whereas TFTs playing a role of optical sensor elements have no problems at all). For example, in a case of a display device having such optical sensor circuits, this would be problematic because aperture ratios of pixels unfortunately become low.

Moreover, the sensor section 113 requires a plurality of transistors and capacitors. In a case where the plurality of transistors provided in the sensor section 113 are configured by bottom gate transistors similar to the one disclosed in Patent Literature 1, there need to be numerous holes for connecting the transistors with capacitors correspondingly.

In the circuit board illustrated in FIG. 16, for example, the sensor section 113 has three contact holes 117, 118, and 119.

Formation of such contact holes requires wires and electrodes to have a certain amount of area over or below where the contact holes are formed. This causes a problem that the sensor 113 cannot be reduced in area. Then, an increase in the area of the sensor 113 results in low aperture ratios.

The present invention has been made in order to solve the problem, and it is an object of the present invention to provide (i) a configuration which makes it possible to (a) enhance the performance of a circuit board equipped with TFTs differing in their respective functions as circuit components and (b) reduce an area necessary for mounting the TFTs on the circuit board and (ii) a method for producing the circuit board.

Solution to Problem

In order to attain the object, a circuit board of the present invention includes a plurality of transistor elements on an insulating substrate, at least one of the plurality of transistor elements being a first thin-film transistor element including, as a channel layer, a semiconductor which has a relatively large mobility and a relatively low sensitivity to light, at least one of the others of the plurality of transistor elements being a second thin-film transistor element (i) being different from the first thin-film transistor element in terms of functions as circuit components, (ii) including, as a channel layer, a semiconductor which has a relatively small mobility and a relatively high sensitivity to light, and the first thin-film transistor element being a top gate transistor, and the second thin-film transistor element being a bottom gate transistor.

With the configuration, in which the first thin-film transistor elements include, as the channel layers, the semiconductors each having relatively large mobility, the first thin-film transistor elements can produce high output voltage without being large in size. Therefore, the first thin-film transistor elements each have a first characteristic of capable of alleviating a reduction in aperture ratios of pixels while having low sensitivity to light. Additionally, with the configuration, the second thin-film transistor elements each have a second characteristic of having high sensitivity to light while generating a low output voltage due to their low mobility.

That is, the thin-film transistor element each having the first characteristic and the thin-film transistor element each having the second characteristic can serve different functions as circuit components. Therefore, with the configuration, it is possible to obtain a high-performance circuit board equipped with an electric circuit taking advantage of each of the different functions.

According to the configuration, (i) the first thin-film transistor elements are top gate transistors and (ii) the second thin-film transistor elements are bottom gate transistors. This makes it possible to provide, on a layer, (a) drain electrodes of the second thin-film transistor elements, (b) source electrodes of the second thin-film transistor elements, and (c) gate electrodes of the first thin-film transistor elements.

Hence, it is possible to configure, without providing contact holes, an electric circuit in which output electrodes of the second thin-film transistor elements are connected to the gate electrodes of the first thin-film transistor elements. This makes it possible to configure, for example, the electric circuit such that driving of the first thin-film transistor elements is controlled according to outputs from the electrodes of the second thin-film transistor elements without providing contact holes.

Therefore, it is possible to (i) simplify the process of producing such an electric circuit and (ii) reduce areas of regions necessary for providing contact holes. This makes it possible to reduce the area of regions necessary for mounting of the electric circuit, and therefore to further limit a reduction in aperture ratios of pixels.

A method of the present invention for producing a circuit board is for producing a circuit board in which a first thin-film transistor element and a second thin-film transistor element, which differ from each other in their respective functions as circuit components, are provided on an insulating substrate, the respective functions being different due to use of different types of semiconductors from which respective channel layers of the first thin-film transistor element and the second semiconductor transistor element are formed, said method comprising the steps of: forming an insulating film on both the channel layer of the first thin-film transistor element and a gate electrode of the second semiconductor transistor element, which are patterned on the insulating substrate; and patterning an identical conductive layer on the insulating film into (i) a gate electrode of the first thin-film transistor element, (ii) a source electrode of the second thin-film transistor element, and (iii) a drain electrode of the second thin-film transistor element.

With the configuration, it is possible (as already described in the sections above regarding the invention of the circuit board) to reduce the area of regions necessary for installation of the electric circuit so that a reduction in aperture ratios of pixels can be limited. This makes it possible to inexpensively produce a high-performance circuit board.

Advantageous Effects of Invention

A circuit board of the present invention includes a plurality of transistor elements on an insulating substrate, at least one of the plurality of transistor elements being a first thin-film transistor element including, as a channel layer, a semiconductor which has a relatively large mobility and a relatively low sensitivity to light, at least one of the others of the plurality of transistor elements being a second thin-film transistor element (i) being different from the first thin-film transistor element in terms of functions as circuit components, (ii) including, as a channel layer, a semiconductor which has a relatively small mobility and a relatively high sensitivity to light, and the first thin-film transistor element being a top gate transistor, and the second thin-film transistor element being a bottom gate transistor.

Therefore, it is possible to (i) obtain a high-performance circuit board equipped with an electric circuit taking advantage of each of different functions and (ii) reduce the area of regions necessary for installation of the electric circuit.

A method of the present invention for producing a circuit board is for producing a circuit board in which a first thin-film transistor element and a second thin-film transistor element, which differ from each other in their respective functions as circuit components, are provided on an insulating substrate, the respective functions being different due to use of different types of semiconductors from which respective channel layers of the first thin-film transistor element and the second semiconductor transistor element are formed, said method comprising the steps of: forming an insulating film on both the channel layer of the first thin-film transistor element and a gate electrode of the second semiconductor transistor element, which are patterned on the insulating substrate; and patterning an identical conductive layer on the insulating film into (i) a gate electrode of the first thin-film transistor element, (ii) a source electrode of the second thin-film transistor element, and (iii) a drain electrode of the second thin-film transistor element.

Therefore, it is possible to inexpensively produce a high-performance circuit board.

BRIEF DESCRIPTION OF DRAWINGS

FIG. 7 is a circuit diagram illustrating configurations of protection circuits and pixel circuits both built in a region Sb illustrated in FIG. 6.

DESCRIPTION OF EMBODIMENTS

Embodiment 1

The following description will discuss Embodiment 1 of the present invention with reference to the drawings. However, the size, material, shape, and relative arrangements of constituent members described in Embodiment 1 are not to limit the scope of the present invention unless specifically described so, and are merely illustrative.

(Basic Configuration of Circuit Board)

Figure 1:
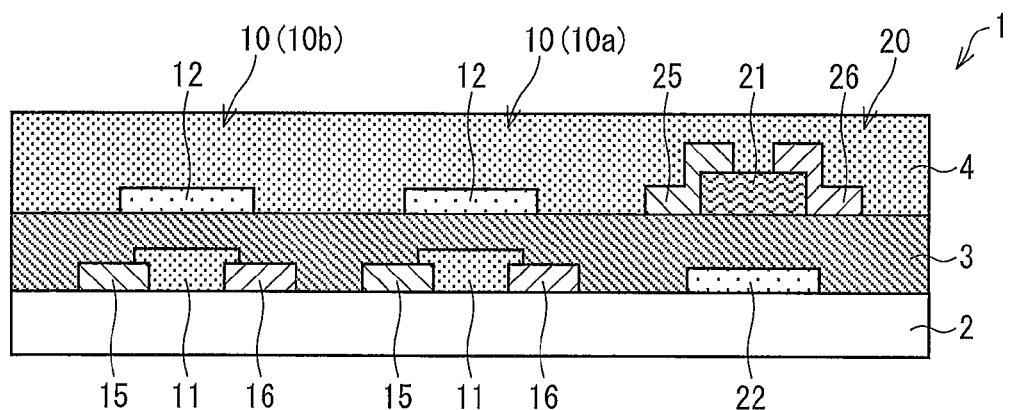
FIG. 1 is a cross-sectional view schematically illustrating a basic configuration of a circuit board in accordance with Embodiment 1 of the present invention.

A basic configuration of circuit board 1 of the present invention will be described first with reference to FIG. 1. FIG. 1 is a cross-sectional view schematically illustrating the basic configuration of the circuit board 1.

As illustrated in FIG. 1, the circuit board 1 includes a plurality of transistor elements, provided on an insulating substrate 2, which correspond to pixels (see FIG. 3) arranged in matrix form.

At least one of the plurality of transistors is a first thin-film transistor element. The first thin-film transistor element includes, in the form of a channel layer (also called an active layer), a semiconductor material having (i) relatively large mobility and (ii) relatively low sensitivity to light. Note that, in Embodiment 1, the channel layer 11 included in the first thin-film transistor element is made of an oxide semiconductor. Note also that the first thin-film transistor element is hereinafter referred to as an oxide TFT 10. An amorphous oxide (IGZO) represented by In—Ga—Zn—O is suitable for the oxide semiconductor, while a multicrystalline material represented by a zinc oxide (ZnO) can be also used for the oxide semiconductor.

Additionally, at least another one of the plurality of transistor elements is a second thin-film transistor element. The second thin-film transistor element includes, in the form of a channel layer 21, a semiconductor whose sensitivity to light is relatively high. The second thin-film transistor element differs from the oxide TFT 10 in their functions in the circuit. Note that (i) in Embodiment 1, the channel layer 21 included in the second thin-film transistor element is made of an amorphous hydroxide silicon semiconductor (a-Si:H) and (ii) the second thin-film transistor element is hereinafter referred to as a-SiTFT 20.

Examples of the constituent material for each channel layer 21 are not limited to an amorphous silicon semiconductor, but encompass (i) a microcrystalline silicon semiconductor (i.e. μm-Si) and (ii) a laminated semiconductor in which a-Si:H and μc-Si are stacked together. A laminated semiconductor can cover (receive light within) a wavelength range which cannot be covered by a layer, and therefore can make up an optical sensor element which is highly sensitive to light within a wide wavelength range.

Configurations of the oxide TFTs 10 and of the a-SiTFT 20 will be described later in detail.

According to the above configuration, the oxide TFT 10 can produce a high output voltage (20 times greater in mobility than an a-SiTFT) without the need of having a large size. This means that the oxide TFT 10 has a first characteristic of being capable of alleviating a reduction in aperture ratios of pixels while having low sensitivity to light (especially visible light). The a-SiTFT 20 has a second characteristic of having high sensitivity to light while generating a low output voltage due to its low mobility.

That is, the oxide TFT 10 having the first characteristic and the a-SiTFT 20 having the second characteristic can serve different functions in the circuit. Therefore, with the configuration, it is possible to obtain a high-performance circuit board 1 equipped with an electric circuit taking advantage of each of the different functions.

Figure 17:
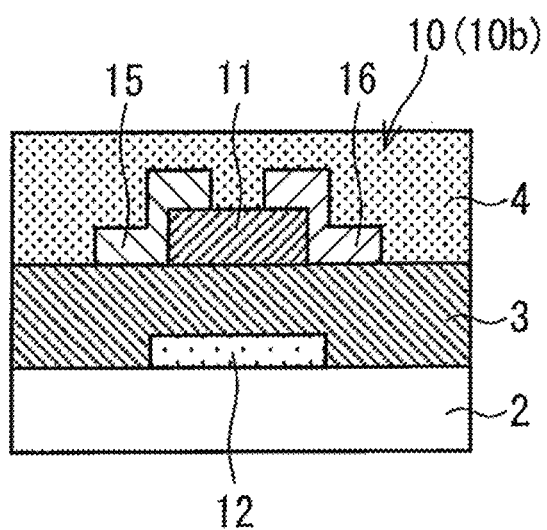
FIG. 17 is a plan view illustrating a bottom gate oxide transistor of the image display device.

Furthermore, in a case where the circuit board 1 is used as a circuit in a display device including an optical sensor circuit, (i) a diode section is configured by a bottom gate oxide TFT 10, (ii) a transistor for use in an output amplifier (Tr section) is configured by a top gate a-SiTFT 20, and (iii) a switching element for driving each pixel is configured by the bottom gate oxide TFT 10 (as shown in FIG. 17, the details of which will be described later).

Hereinafter, where appropriate, the oxide TFT 10 may be distinguishedly referred to as (i) an oxide TFT 10*a*, one for use as the Tr section and (ii) an oxide TFT 10*b*, one for use as the switching element for driving a pixel provided in a display section.

The oxide TFTs 10 (10*a*, 10*b*) include, as films, a channel layer 11 (11*a*, 11*b*), a source electrode 15 (15*a*, 15*b*), and a drain electrode 16 (16*a*, 16*b*), which are arranged side by side on the insulating substrate 2. The channel layer 11 is provided to partially cover sides of the source electrode 15 and a side of the drain electrode 16.

A gate insulating film 3, which consists mainly of $SiO_2$, is provided as a film on the insulating substrate 2 so as to cover the channel layer 11, the source electrode 15, and the drain electrode 16. A gate electrode 12 (12*a*, 12*b*) are provided as a film on the gate insulating film 3.

The a-SiTFT 20 includes, as films, a gate electrode 22 provided on the insulating substrate 2. The gate insulating film 3 is provided on the insulating substrate 2 so as to cover the gate electrode 22. The channel layer 21, a source electrode 25, and a drain electrode 26 are arranged in film forms and are provided, side by side, on the gate insulating film 3. The source electrodes 25 and the drain electrodes 26 are provided so as to partially cover sides of the channel layer 21.

The oxide TFTs 10 and the a-SiTFT 20 are covered with and protected by a passivation film 4 which consists mainly of $SiN_x$.

The oxide TFTs 10 are thus configured in top gate structures, and the a-SiTFT 20 is thus configured in bottom gate structures. This makes it possible to provide, on a layer, (i) the source electrode 25 and the drain electrodes 26 of the a-SiTFT 20 and (ii) the gate electrodes 12 of the oxide TFTs 10.

Thus, without a contact hole, the drain electrode 26 of the a-SiTFT 20 can be connected with the gate electrode 12 of the oxide TFT 10. This configuration eliminates the need of forming a contact hole, for example, in configuring an electric circuit such as an optical sensor circuit configured such that driving of the oxide TFT 10 is controlled according to an output from the a-SiTFT 20.

Therefore, it is possible to (i) simplify the process of producing such an electric circuit and (ii) reduce areas of regions necessary for making contact holes. This makes it possible to further alleviate a reduction in aperture ratios of pixels.

Since the oxide TFTs 10 are less sensitive to light than the a-SiTFTs 20, the oxide TFTs 10 can each be suitably used as a switching element for driving a display section of each pixel. Compared with a case where the a-SiTFTs 20 are used as switching elements for driving the display section, this makes it possible to prevent the deterioration of the semiconductor layers of the switching elements, which deterioration is caused due to light emitted from a backlight. Moreover, since there is no need to provide a light shielding layer as a bottom layer of the switching elements, it is also possible to allow for a reduction in a material cost and in a production process.

Moreover, the a-SiTFT 20 is of bottom-gate type. Therefore, in a case where the circuit board 1 is mounted on a display device that modulates a light emission intensity of a backlight with the use of pixels, it is possible to use the gate electrode 22 to block light of the backlight. This makes it possible to prevent, without additionally providing a light shielding layer, property deteriorations of the channel layer 21.

Note that (i) the source electrode 15, the drain electrode 16, and the gate electrode 22 are provided in an identical conductive layer and (ii) the gate electrode 12, the source electrode 25, and the drain electrode 26 are provided in an identical conductive layer (described later in the description of the process of producing the circuit board 1).

Therefore, in a case where the circuit board 1 is mounted on a display device including a backlight, it is possible (as described earlier) to simplify a production process and to reduce material cost, without compromising advantages such as (i) suppression of a reduction in aperture ratios of pixels, (ii) high sensitivity to light, and (iii) fast response speed.

(Modifications of TFTs)

Figure 2:
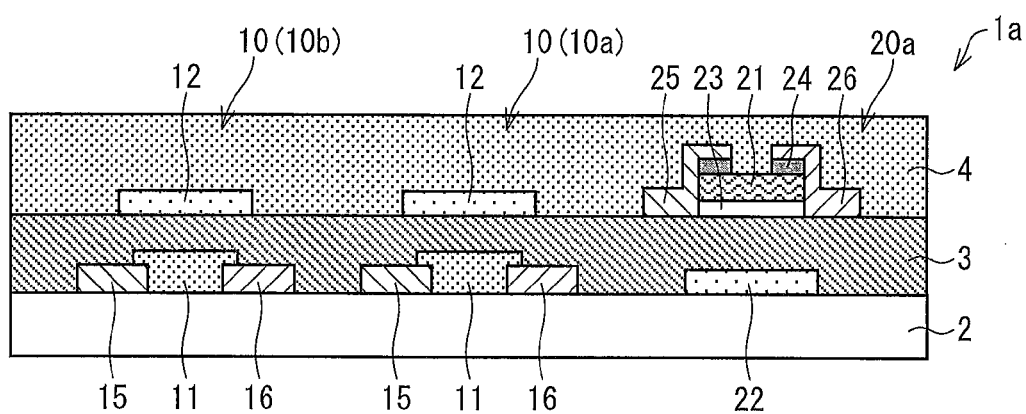
FIG. 2 is a view illustrating a modification of the circuit board illustrated in FIG. 1.

FIG. 2 is a cross-sectional view illustrating a modification of a circuit board.

As illustrated by how one of a-SiTFTs 20*a* is provided in FIG. 2, it is possible to provide second gate insulating films (second insulating layer) 23, each of which consists mainly of $SiN_x$, as underlayers of channel layers 21.

According to a circuit board 1*a*, channel layers 11 of oxide TFTs 10 are sandwiched between an insulating substrate 2 and a gate insulating film 3 (first insulating film) consisting mainly of oxide $SiO_2$.

On the other hand, the a-SiTFT 20 includes double-layered insulating films of $SiN_x$ and of $SiO_2$ (the gate insulating film 3 and the gate insulating layer 23). As a result, the channel layer 21 of the a-SiTFT 20*a* is sandwiched between (i) the gate insulating film 23 which consists mainly of nitride $SiN_x$ and (ii) a passivation film 4 which consists mainly of $SiN_x$.

The gate insulating film 3 is provided also as a layer shared by the oxide TFTs 10 and the a-SiTFT 20.

With this configuration, it is possible that oxide semiconductors configuring the channel layers 11 and amorphous silicon semiconductors configuring the channel layer 21 can be in contact with a suitable gate insulating film and a suitable passivation film respectively.

In a case where an oxide semiconductor comes into contact with a chemically reducing material, the oxide semiconductor becomes reduced so as to be deteriorated in its characteristics. With the configuration, however, the channel layers 11 (oxide semiconductors) are in contact with the gate insulating film 3 (oxide). Therefore, it is possible to prevent the deterioration of the characteristics of the channel layers 11.

In a case where an amorphous silicon semiconductor comes into contact with an oxide, the amorphous silicon semiconductor becomes oxidized so as to be deteriorated in its characteristics. With the configuration, however, the channel layers 11 (amorphous silicon semiconductors) are in contact with the respective gate insulating films 23 and with the passivation film 4 (reducible material). Therefore, it is possible to prevent the deterioration of the characteristics of the channel layers 21.

Additionally, a conductive layer 24 is stacked on the channel layer 21, which conductive layer 24 is divided into a source side and a drain side. Examples of a material for the conductive layer 24 encompass n+a-Si and n+μc-Si, each of which is doped with relatively high n-type impurity concentration.

(Modification 2 of TFT)

As described above, the circuit board 1a is configured such that the a-SiTFTs 20a each include double-layered insulating films of the first gate insulating film 3 and of the second gate insulating film 23.

In contrast to the configuration of FIG. 2, however, it is also possible to configure, by substituting $SiO_2$ with $SiN_x$ as a primary component of the first gate insulating film 3, the oxide TFTs 10 to each include double-layered insulating films.

Figure 13:
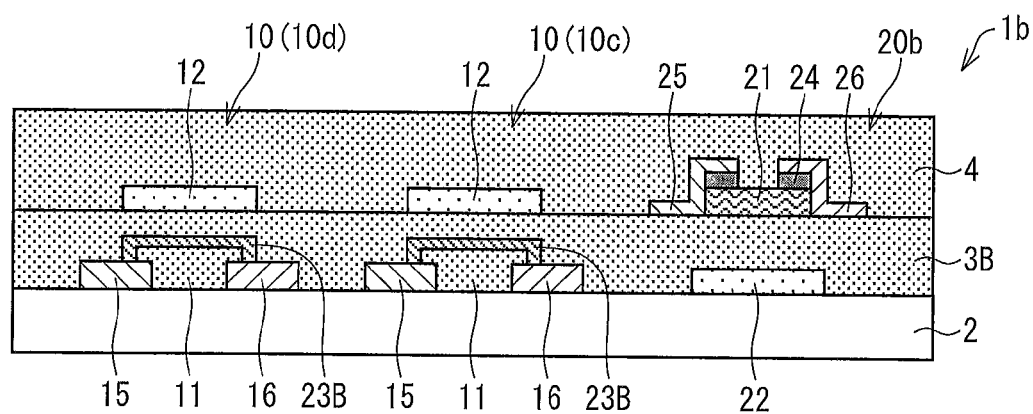
FIG. 13 is a view illustrating another modification of the circuit board illustrated in FIG. 1.
Figure 14:
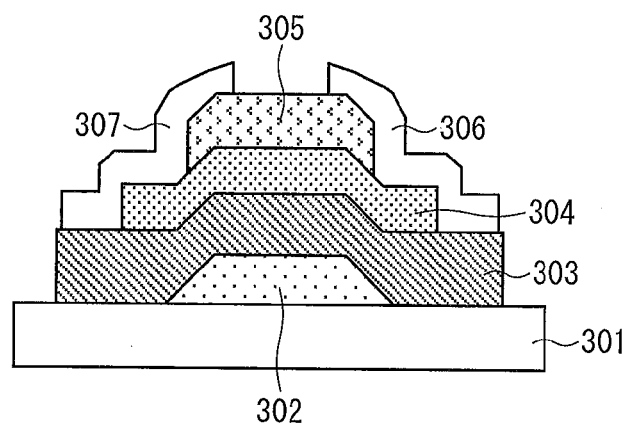
FIG. 14 is a cross-sectional view illustrating a configuration of a conventional TFT of a bottom-gate type (inverted staggered type).
Figure 15:
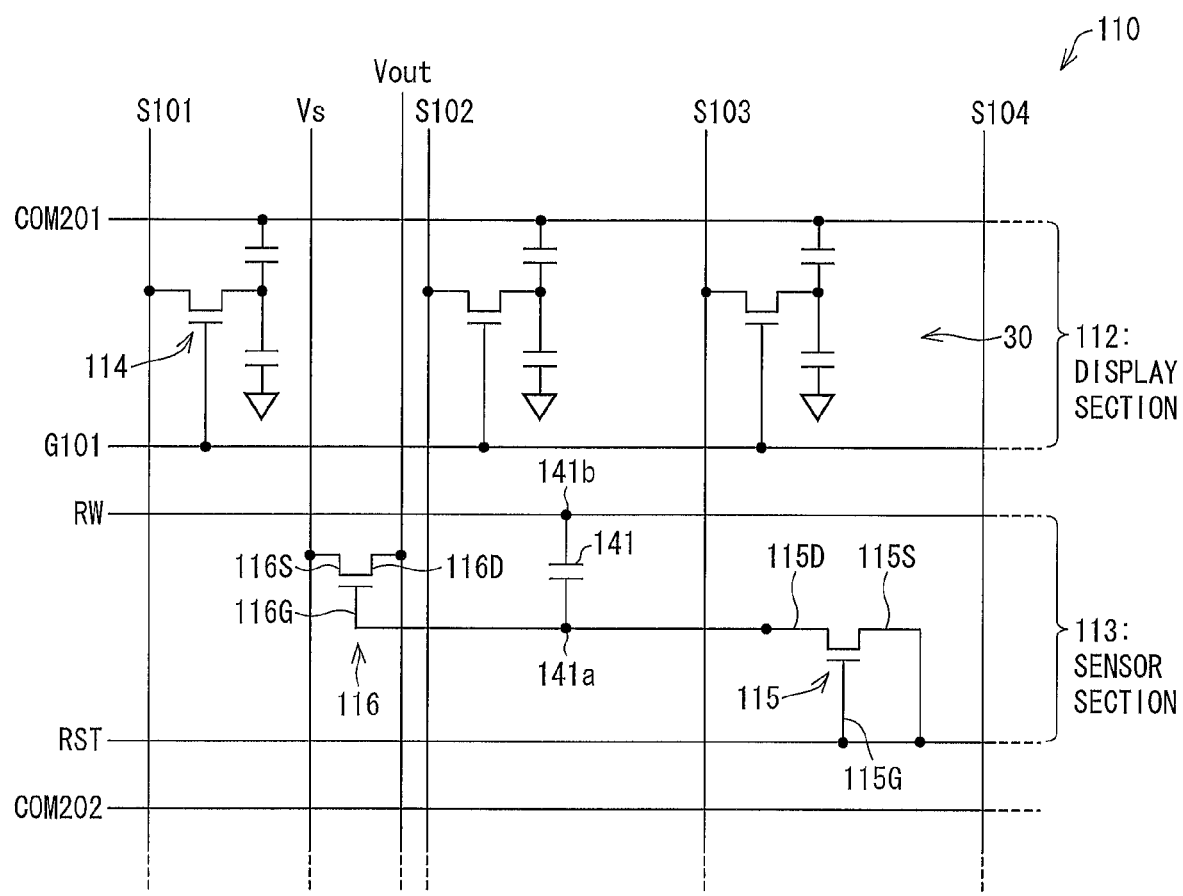
FIG. 15 is a circuit diagram illustrating a configuration of an image display device including a conventional optical sensor circuit.
Figure 16:
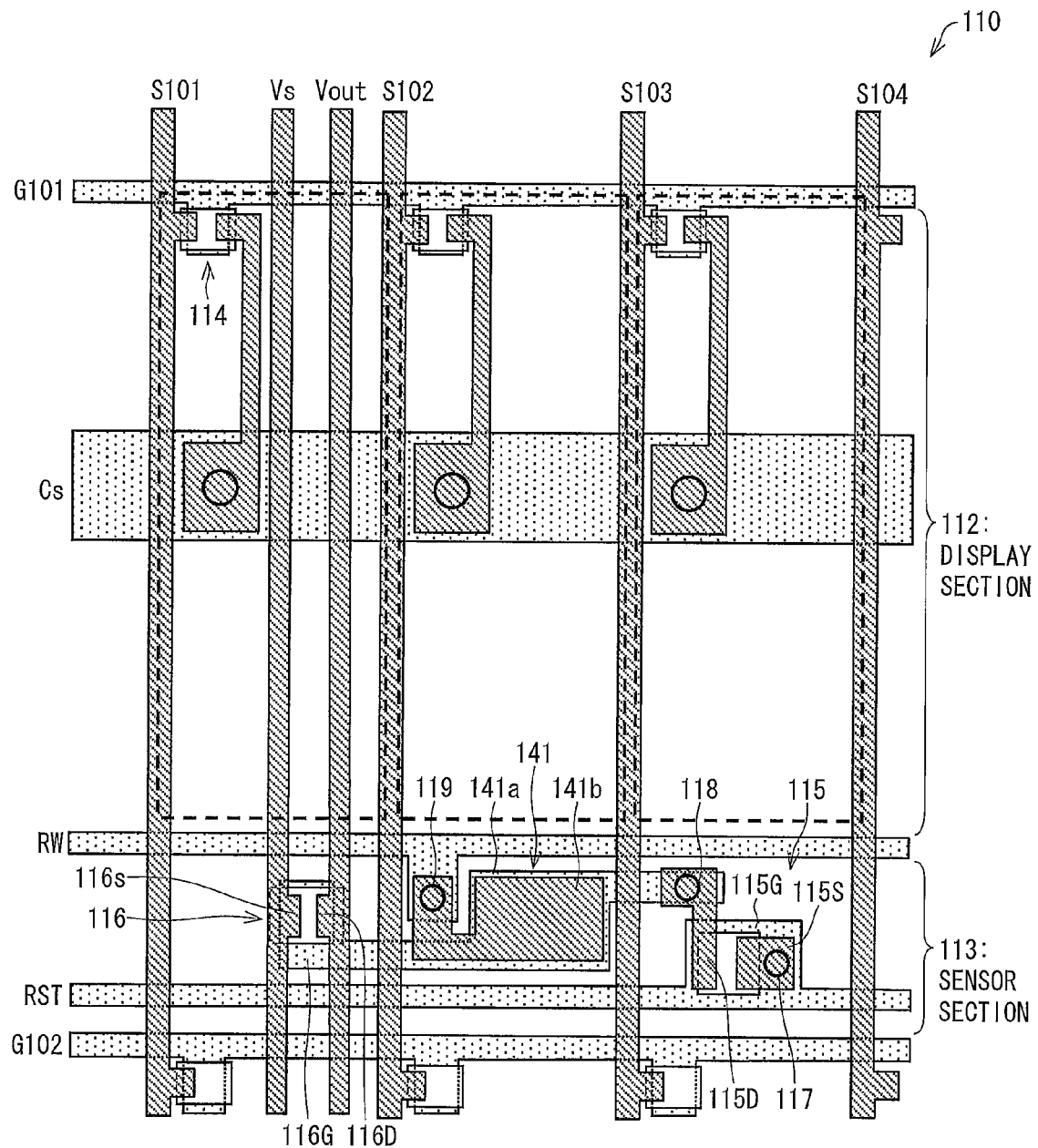
FIG. 16 is a plan view illustrating transistors of the image display device, each of which transistors is configured in a bottom-gate structure.

The details of the double-layered structure are illustrated in FIG. 13. FIG. 13 is a cross-sectional view schematically illustrating a modification of a basic structure of the circuit board illustrated in FIGS. 1 and 2. Note that, in FIG. 13, members whose functions are the same as those of the members illustrated in FIGS. 1 and 2 are given the same reference numerals/signs accordingly, and their description will be omitted.

A circuit board 1b illustrated in FIG. 13 includes (i) oxide TFTs 10 (10c, 10d) each configured as a top gate transistor and (ii) an a-SiTFT 20b configured as a bottom gate transistor.

More specifically, the oxide TFTs 10c, 10d each include (i) a gate electrode 12 of a top-gate type provided on a first gate insulating film (first insulating film) 3B consisting mainly of $SiN_x$ and (ii) a second gate insulating film (second insulating layer) 23B, consisting mainly of $SiO_2$, which is provided as a film so as to cover a channel layer 11, which second gate insulating film 23B is provided between the first gate insulating film (first insulating film) 3B and the channel layer 11.

The a-SiTFT 20b includes a gate electrode 22 of a bottom-gate type as an underlayer of the first gate insulating film (first insulating film) 3B that is shared with the oxide TFTs 10 (10a, 10b). A channel layer 21 is provided, as a film, directly on the first gate insulating film 3B.

The configurations of the oxide TFTs 10c, 10d are the same as those of the oxide TFTs 10a, 10b illustrated in FIG. 2 except that the former is provided with the respective second gate insulating films 23B. The configuration of the a-SiTFT 20b is the same as that of the a-SiTFT 20a illustrated in FIG. 2 except that the latter is provided with the second gate insulating film 23.

The configuration illustrated in FIG. 13 is also the same as that of FIG. 2 in that the oxide TFTs 10c, 10d and the a-SiTFT 20b are covered with and protected by a passivation film 4.

(Circuit Configuration Example—Optical Sensor Circuit)

Figure 3:
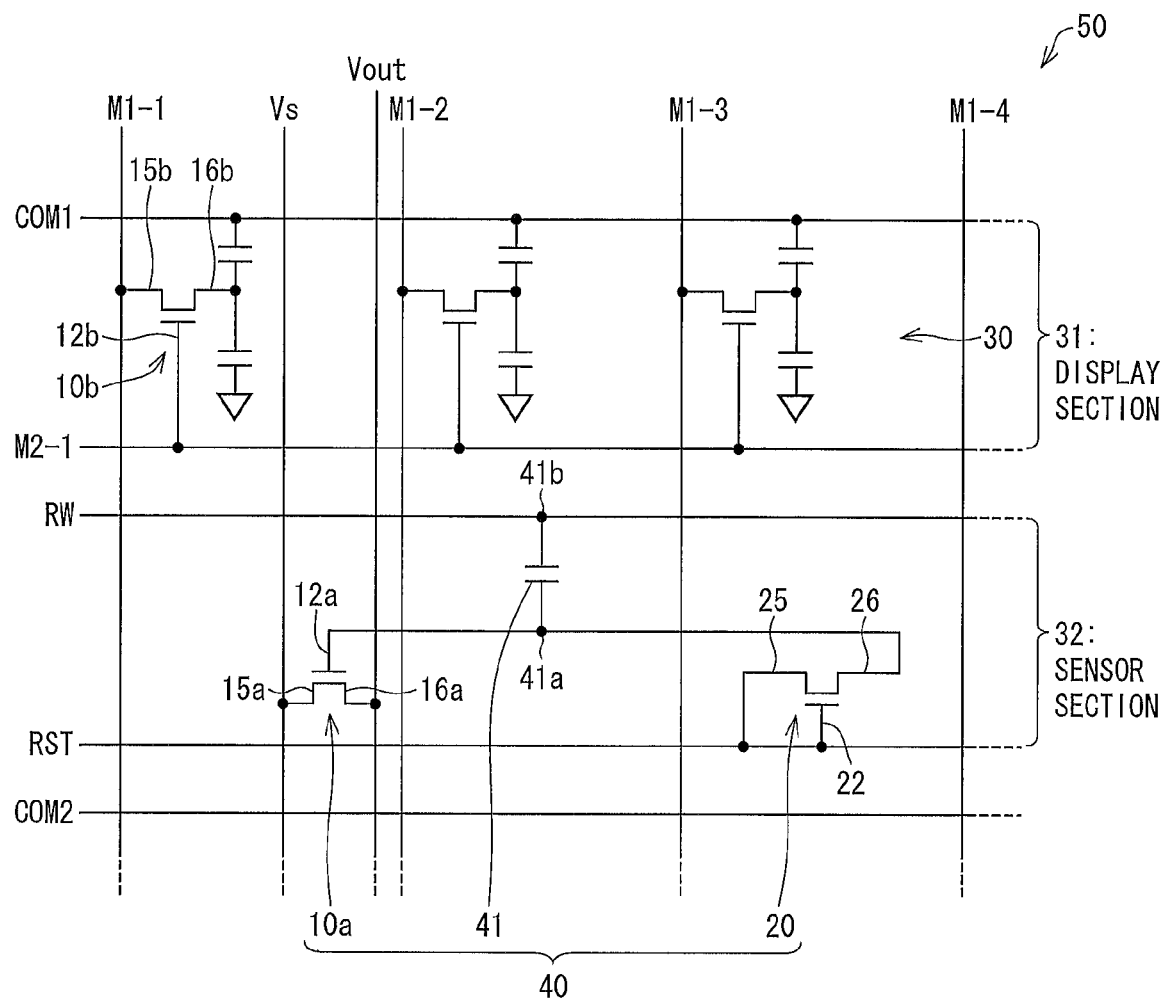
FIG. 3 is a circuit diagram illustrating a circuit configuration of a liquid crystal display device in which a plurality of pixels and optical sensor circuits are provided on an active matrix substrate.

FIG. 3 illustrates an equivalent circuit of a liquid crystal display device 50 including an optical sensor circuit.

FIG. 3 is a circuit diagram illustrating a circuit configuration of the liquid crystal display device 50 in which a plurality of pixels 30 and an optical sensor circuit 40 are provided on an active matrix substrate. This active matrix substrate is equivalent to the circuit board 1.

Note that FIG. 3 illustrates a circuit configuration built in a region Sa which is illustrated on a display panel 51 of the liquid crystal display device 50 (described later with reference to FIG. 6).

The display panel 51 is provided with, in matrix form, (i) display sections 31 on which the pixels 30 are arranged and (ii) sensor sections 32 on which the optical circuits (electric circuit) 40 are provided.

As illustrated in FIG. 3, the optical circuits 40 each include the oxide TFT 10a, the a-SiTFT 20, and a boost capacitor 41. The oxide TFT 10a plays a role of a sensor output (Tr: output amplifier) of the optical sensor circuit 40. The a-SiTFT 20 plays a role of an optical sensor element (diode) of the optical sensor circuit 40.

More specifically, the optical sensor circuit 40 is configured as a circuit of a 1T (abbreviation of "transistor") system which employs only a single transistor playing a role of a sensor output. The oxide TFT 10a functions as a source follower transistor (voltage follower transistor).

A source electrode (input electrode) 15a of the oxide TFT 10a is connected to an AMP power supply bus line Vs. A drain electrode (output electrode) 16a is connected to an optical sensor output bus line Vout. The AMP power supply bus line Vs and the optical sensor output bus line Vout are both connected to a sensor readout circuit 55 illustrated in FIG. 4 (described later). A power source voltage VDD outputted from the sensor readout circuit 55 is applied to the AMP power source bus line Vs.

A gate (base) electrode 12a of the oxide TFT 10a is connected to (i) a drain electrode (output electrode) 26 of the a-SiTFT 20 functioning as a photodiode and (ii) a terminal 41a which is one of two terminals of the boost capacitor 41.

The source electrode (input electrode) 25 of the a-SiTFT 20 and the gate (base) electrode 22 are both connected to a photodiode resetting wire RST so as to be short-circuited. In other words, the a-SiTFT 20 has a diode-connected configuration, and functions as a photodiode designating (i) the source electrode 25 as an anode and (ii) the drain electrode 26 as cathode.

As described later, the source electrode 25 of the a-SiTFT20 is connected to the photodiode resetting wire RST to which a reset signal RST is supplied from a sensor scanning signal line drive circuit 54 illustrated in FIG. 6. A terminal 41b, which is the other terminal of the boost capacitor 41, is connected to an optical sensor line selecting wire RW through which an optical sensor line selecting signal RWS is transmitted. Note that an optical sensor line selecting signal RW serves to (i) select a specific line out of optical sensor circuits arranged in matrix form and then (ii) cause an optical sensor circuit 40 in the specific line to output a detection signal.

According to the configuration, the oxide TFTs 10a can each produce a high output voltage without being large in size. This means that the oxide TFTs 10a each have the first characteristic of being capable of alleviating a reduction in aperture ratios of pixels while having low sensitivity to light. Therefore, the oxide TFTs 10a are suitable for the roles of sensor outputs of the respective sensor circuits 40.

On the other hand, the a-SiTFTs 20 each have the second characteristic of having high sensitivity to light while generating a low output voltage due to its low mobility. Therefore, the a-SiTFTs 20 are suitable for the roles of optical sensor elements of the respective optical sensor circuits 40. Note that an optical sensor element is required to have sensitivity to light within a wavelength range of either an ultraviolet-ray region, a visible light region, or an infrared-ray region. An a-Si:H has excellent sensitivity to light within almost the entire visible light region in such a manner that the sensitivity has its peak in the vicinity of wavelengths of 600 nm to 700 nm.

Hence, with the oxide TFTs 10a and the a-SiTFTs 20, it is possible to configure optical sensor circuits 40 each having such advantages as (i) suppression of a reduction in aperture ratios of pixels, (ii) high sensitivity to light, and (iii) fast response speed. The same applies in a case where the channel layer 21 of each of the a-SiTFTs 20 is made of (a) a μc-Si semiconductor or (b) a laminated semiconductor in which an a-Si:H and a μc-Si are stacked together.

In addition, such advantages of the optical sensor circuits 40 are extremely advantageous in a case where, for example, a liquid crystal display device having a touch panel function or an image scanning function is configured by mounting a plurality of optical sensor circuits 40 in an active matrix substrate on which pixels using liquid crystals are arranged in matrix format.

(Circuit Diagram of Pixels)

As illustrated in FIG. 3, the active matrix substrate of the liquid crystal display device 50, on which the optical sensor circuit 40 is provided, is further provided with (i) gate wires M2-1(M2-$n$), M2-2((M2-$n$+1) . . . (where n is a natural number representing a line number of a pixel) and (ii) source wires M1-1(M1-$m$), M1-2(M1-$m$+1), M1-3(M1-$m$+3) . . . (where m is a natural number representing a line number of a pixel), which gate wires and source wires are provided in matrix form. Switching elements for driving the respective pixels 30 are provided in locations corresponding to respective intersections of the gate wires and the source wires.

Furthermore, the active matrix substrate of the liquid crystal display device 50 is provided to face a counter substrate via a liquid crystal layer. The counter substrate is provided with common wires COM1, COM2 . . . for the corresponding pixels 30 in such a way that the common wires COM1, COM2 are arranged in parallel to the gate wires M2-1 . . . , 2-n.

The switching element for driving the pixels 30 is configured by the oxide TFT 10$b$. The source electrode 15$b$ of the oxide TFT 10$b$ is connected to the source wire M1-1. The drain electrode 16$b$ is connected to the joint wire COM1 of the counter substrate via the liquid crystal layer that generates capacitance. The drain electrode 16$b$ is also connected to supplemental capacitance. The gate electrode 12$b$ of the oxide TFT 10$b$ is connected to the gate wire M2-1.

The optical sensor circuit 40 can be provided so as to be equal to the pixels 30 in number, or can be provided so as to correspond, in number, to the group consisting of a predetermined number of the pixels 30. The number of the optical sensor circuits 40 need only be determined according to the resolutions required for light detection.

In the example illustrated in FIG. 3, the one optical sensor circuit 40 is provided for three of the pixels 30. Three pixels, R (red), G (green), and B (blue), can be assigned to the respective pixels 30 so that the three pixels 30 as a set produce full color display.

Note that the source wire M1-1 can serve also as the AMP power supply bus line Vs, and that the source wire M1-2 adjacent to the source wire M1-1 can serve also as the optical sensor output bus line Vout.

(Plan-View Configuration of Circuit Board)

Figure 4:
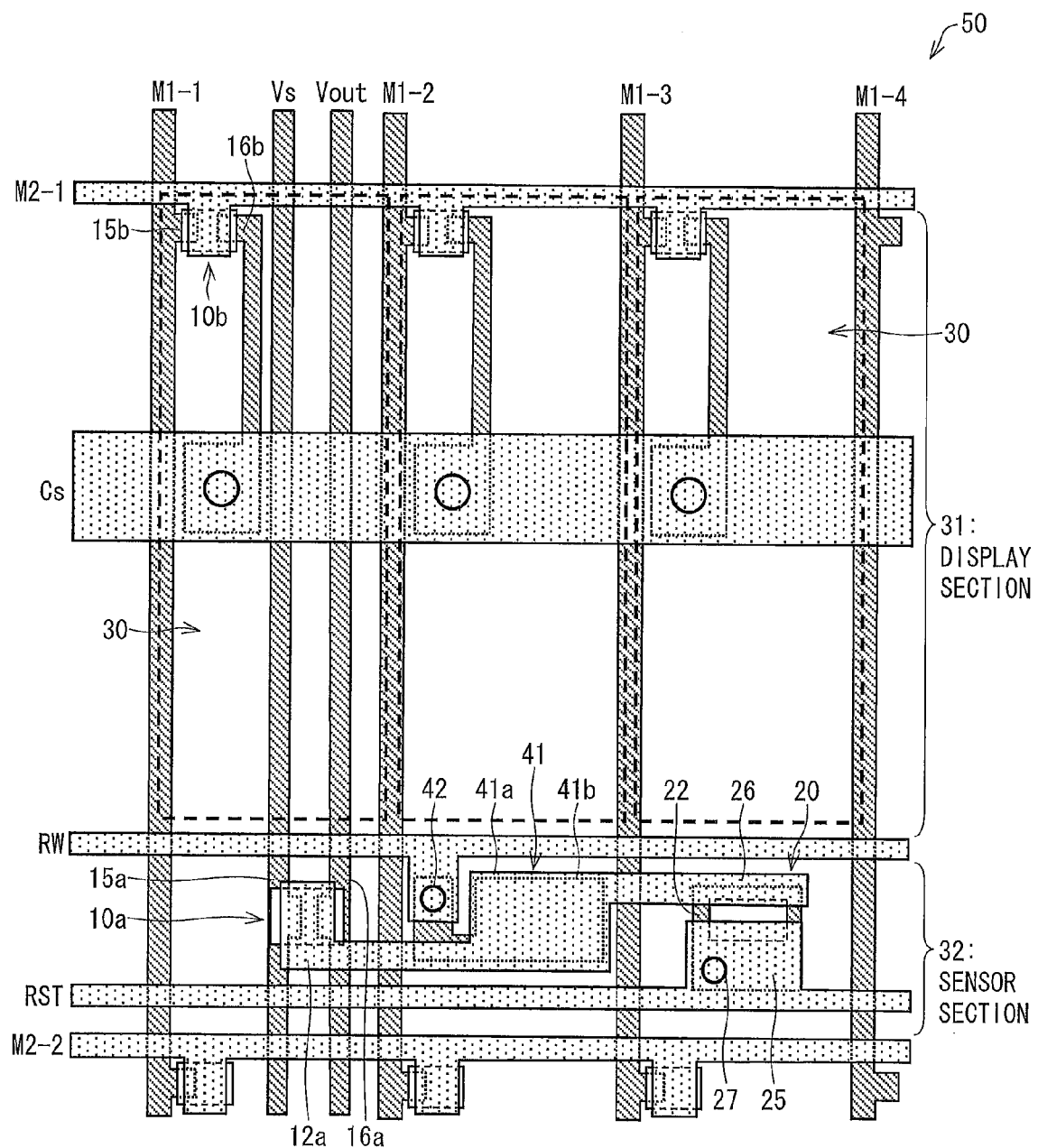
FIG. 4 is a plan view illustrating a configuration of the active matrix substrate of the liquid crystal display device.

The following description will discuss, with reference to FIG. 4, a configuration example in a case where the circuit board 1 is used as the active matrix substrate of the liquid crystal display device 50.

FIG. 4 is a plan view illustrating a configuration of an active matrix substrate of a liquid crystal display device.

The source wires M1-1, M1-2, M1-3, M1-4 . . . , AMP power supply bus lines Vs, and the optical sensor output bus lines Vout are below and intersect the gate wires M2-1, M2-2 . . . , supplemental capacitance wires Cs, optical sensor row selecting signals RW, and photodiode resetting wires RST.

A source electrode 25 of an a-SiTFT 20 is provided so as to extend from the photodiode resetting wire RST toward the optical sensor row selecting wire RW, and is an extending part of the photodiode resetting wire RST. The source electrode 25 is connected to a gate electrode 22 via a contact hole 27. A drain electrode 26, which is provided on the same layer on which the source electrode 25 is provided, is connected to a gate electrode 12$a$ of an oxide TFT 10$a$ via a terminal (wire) 41$a$ which is one of two terminals of a boost capacitor 41.

In other words, in the circuit board 1, the gate electrode 12$a$ of the oxide TFT 10$a$ and the drain electrode (output electrode) 26 of the a-SiTFT 20 are provided on an identical conductive layer, and are connected to each other via the terminal (wire) 41$a$.

A gate insulating film 3 is provided underneath the terminal 41$a$. A terminal 41$b$, which is the other terminal of the boost capacitor 41, is further provided underneath the gate insulating film 3. The terminal 41$b$ is connected, via a contact hole 42, to an extending part extending from the optical sensor row selecting signal RW toward the photodiode resetting wire RST.

A drain electrode 16$a$ of the oxide TFT 10$a$ serves also as the AMP power supply bus line Vs. A source electrode 15$a$ of the oxide TFT 10$a$ serves also as the optical sensor output bus line Vout.

The a-SiTFT 20 is thus configured in a bottom-gate structure, and the oxide TFT 10$a$ is thus configured in a top-gate structure. This allows the drain electrode 26 of the a-SiTFT 20 and the gate electrode 12$a$ of the oxide TFT 10$a$ to be (i) connected to each other via the terminal 41$a$ so as to pass over the plurality of source wires (M1-2 and M1-3 in the example illustrated in FIG. 3), (ii) provided on a layer, and (iii) made of the same material.

Hence, it is possible to connect the gate electrode 12$a$ and the drain electrode 26 to each other without providing a contact hole. This makes it possible to reduce the area of regions necessary for making contact holes.

Therefore, it is possible to increase display sections 31 in area, thereby alleviating a reduction in aperture ratios of pixels.

Additionally, each of the pixels 30 includes the oxide TFT 10$b$. A source electrode 15$b$ of the oxide TFT 10$b$ is provided as an extending part of the source wire M1-1. A wire extends from a drain electrode 16$a$ of the oxide TFT 10$b$ toward the supplemental capacitance wire Cs, and is connected to the supplemental capacitance wire Cs via a contact hole.

(Method for Producing Circuit Board)

Figure 5:
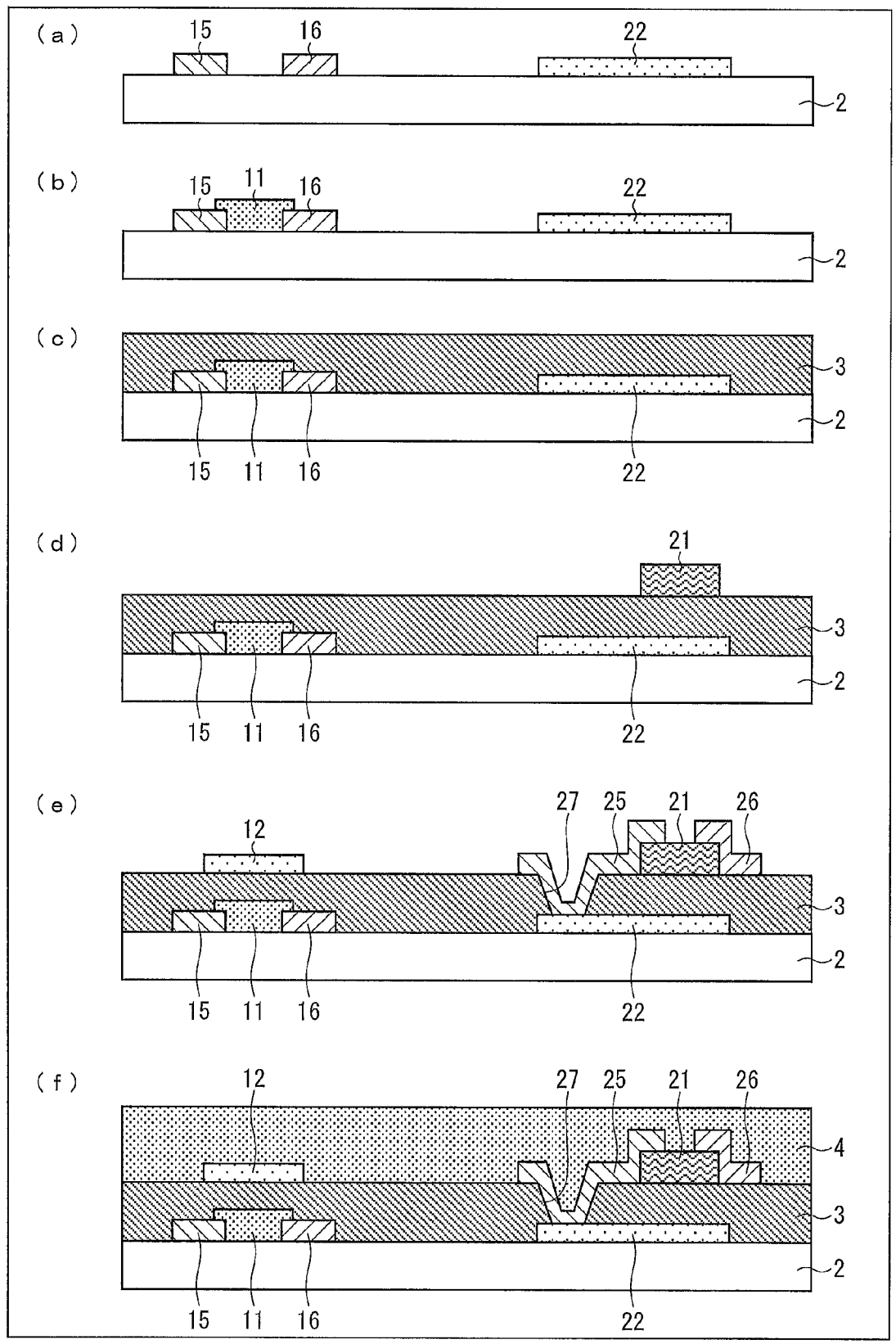
FIG. 5 is a flow chart illustrating, in order, the steps involved in production of the circuit board.

The following description will discuss a method for producing a circuit board 1, with the simplification of the method as a central focus. FIG. 5 is a flow chart illustrating, in order, steps involved in the method for producing the circuit board 1.

The method of the present invention for producing a circuit board is a method for forming oxide TFTs 10 and a-SiTFTs 20 on an insulating substrate 2, which oxide TFTs 10 and a-SiTFTs 20 differ from each other in their respective functions in the circuit as a result of having differing types of semiconductors to form channel layers 11 and 12 respectively (as described before with reference to FIG. 1).

As illustrated in (a) of FIG. 5, a source electrode 15 of the oxide TFT 10, a drain electrode 16 of the oxide TFT 10, and a gate electrode 22 of the a-SiTFT 20 are simultaneously formed (i.e. in one production step) by carrying out patterning of an identical conductive layer formed on the insulating substrate 2 (Step A).

Next, as illustrated in (b) of FIG. 5, the channel layer 11 of the oxide TFT 10 is formed by (i) forming an oxide semiconductor as a film on the insulating film 2 so as to cover the source electrode 15, the drain electrode 16, and the gate electrode 22 and (ii) carrying out patterning of the oxide semiconductor film (Step B).

Next, as illustrated in (c) of FIG. 5$a$, a gate insulating film 3, whose main component is $SiO_2$, is formed on (i) the channel layer 11 and (ii) the gate electrode 22 (Step C).

Next, as illustrated in (d) of FIG. 5, the channel layer 21 of an a-SiTFT 20 is formed by (i) forming an a-Si as a film on the gate insulating film 3 and (ii) carrying out patterning of the a-Si film (Step D). Note that, as demonstrated with the a-Si film 21a of FIG. 2, it is possible to carry out patterning, on the gate insulating film 3, of a gate insulating film 23 consisting mainly of $SiN_x$, and then carry out patterning of the channel layer 21 on the gate insulating film 23.

Next, as illustrated in (e) of FIG. 5, the gate electrode 22 is locally exposed by making a contact hole 27 running through the first gate insulating film 3 so that the a-SiTFT 20 is connected to a diode (Step E).

Next, a gate electrode 12 of the oxide TFT 10, a source electrode 25 of the a-SiTFT 20, and a drain electrode 26 of the a-SiTFT 20 are simultaneously formed (i.e. in one production step) by carrying out patterning of an identical conductive layer on the gate insulating film 3 (Step F). This causes the source electrode 25 and the gate electrode 22 to be connected to each other via the contact hole 27.

Finally, as illustrated in (f) of FIG. 5, the entire top surface is covered with a passivation film 4 (Step G) so that the circuit board 1 is completed.

According to the method of the present invention for producing a circuit board, the gate insulating film 3 shared by the oxide TFT 10 and the a-SiTFT 20 is thus formed all at once (i.e. in one production step). This prevents the production steps from becoming complicated, but rather simplifies them so that a reduction in production costs can be achieved.

Additionally, (i) the source electrode 15 of the oxide TFT 10, the drain electrode 16 of the oxide TFT 10, and the gate electrode 22 of the a-SiTFT 20 are thus formed on the identical conductive layer and (ii) the gate electrode 12 of the oxide TFT 10, the source electrode 25 of the a-SiTFT 20, and the drain electrode 26 of the a-SiTFT 20 are thus formed on the identical conductive layer. This allows for a further simplification of the production process and for a further reduction in production costs.

(Configuration of Display Device)

Figure 6:
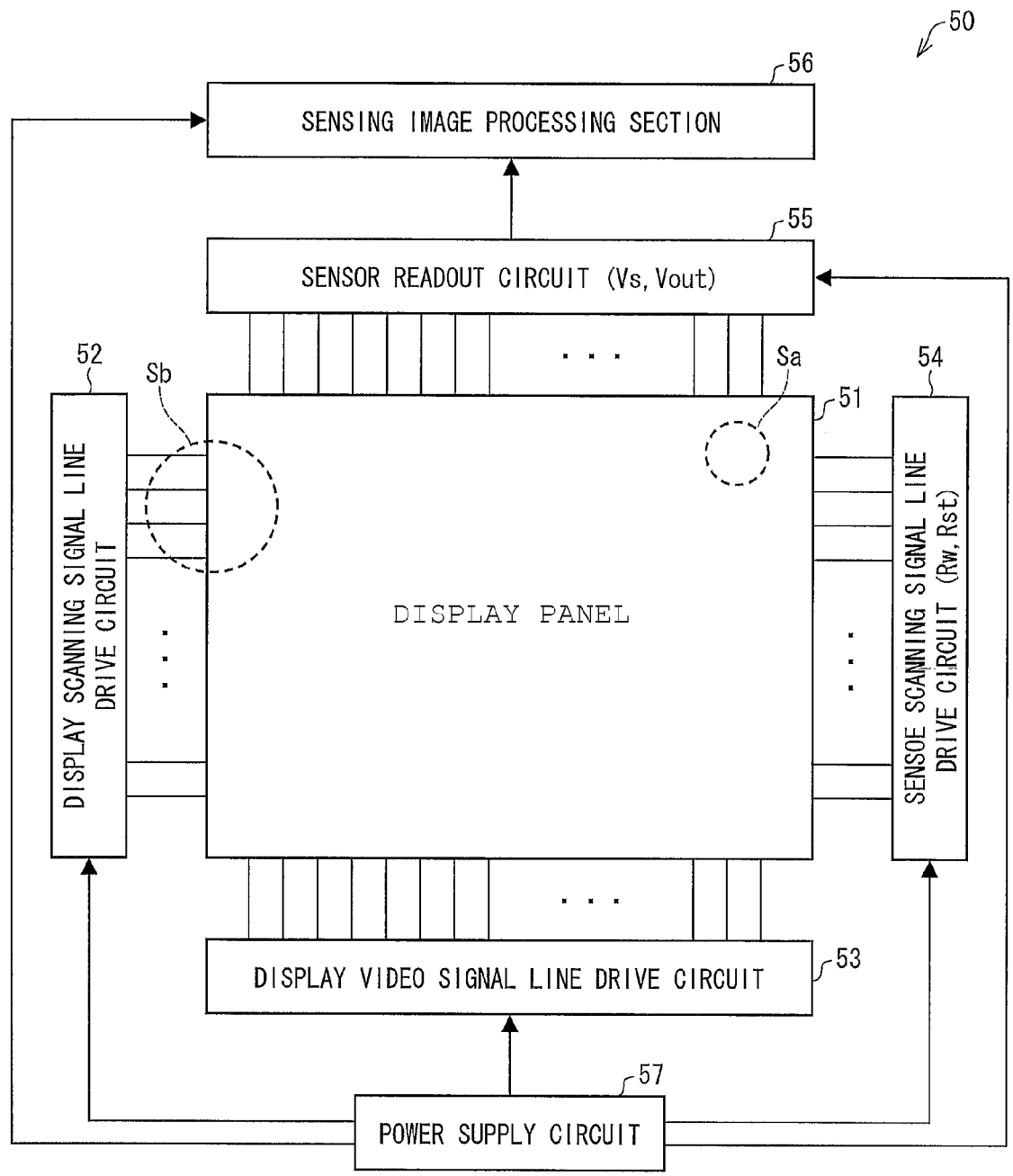
FIG. 6 is a block diagram schematically illustrating a configuration of the liquid crystal display device.

The following description will discuss, with reference to FIG. 6, a configuration of the liquid crystal display device 50 as an example of a display device to be mounted on the circuit board 1.

FIG. 6 is a block diagram schematically illustrating the configuration of the liquid crystal display device 50. As illustrated in FIG. 6, the liquid crystal display device 50 includes (i) the display panel 51, (ii) a display scanning signal line drive circuit 52, (iii) a display video signal line drive circuit 53, (iv) the sensor scanning signal line drive circuit 54, (v) the sensor readout circuit 55, (vi) a sensing image processing section 56, and (vii) a power supply circuit 57.

The display panel 51 includes the active matrix substrate (circuit board 1) and the counter substrate, between which the liquid crystal layer is sandwiched and sealed. In other words, the display panel 51 includes (i) the circuit board 1 configured as the active matrix substrate, (ii) the liquid crystal layer, and (iii) the counter substrate provided to face the active matrix substrate via the liquid crystal layer.

The insulating substrate 2 illustrated in FIG. 1 is a base member of the active matrix substrate, and is a glass substrate, for example. All circuit elements constituting the display scanning signal line drive circuit 52, the display video signal line drive circuit 53, the sensor scanning signal line drive circuit 54, and the sensor readout circuit 55 are monolithically provided on the insulating substrate 2.

Note that the phrase "monolithically provided" (i) means that the circuit elements are directly provided on the insulating substrate 2 through at least one of a physical process and a chemical process and (ii) does not include a configuration in which semiconductor circuits as modules are mounted on the glass substrate.

In a case where the liquid crystal display device 50 is a VA (Vertical Alignment)-mode liquid crystal display device, the counter substrate is provided with (i) a common electrode and (ii) color filters of R (red), G (green), and B (blue). Note that the present invention is not limited to any particular liquid crystal modes, and can therefore be applied to a TN (Twisted Nematic) mode, or even to an IPS (In-Plane Switching) mode (also called electric field laterally applying method) in which a common electrode is provide on an active matrix substrate.

The display scanning signal line drive circuit 52 generates, by use of a gate wire M2-n, a scanning signal for selectively scanning one pixel (line) 30 at a time. The display video signal line drive circuit 53 supplies a video signal to each of the pixels 30 by use of a source wire M1-m.

The sensor scanning signal line drive circuit 54 selects and drives one optical sensor circuit (line) 40 at a time. The sensor readout circuit 55 (i) supplies, by use of the AMP power supply bus line Vsm, each of the optical sensor circuits 40 with a constant power supply voltage VDD and (ii) reads out a light detection signal from each of the optical sensor circuits 40 by use of the optical sensor output bus line Vout.

The sensing image processing section 56 is configured by a member such as an LSI (Large Scale Integrated Circuit) or PC (Programmable Controller). According to a preregistered image processing program, the sensing image processing section 56 processes, the light detection signals outputted from the optical sensor circuits 40 and then generates information such as (a) data of a scanned image of a document or (b) information indicative of where a finger or a pointing device is located with respect to the display panel 51.

The power supply circuit 57 supplies each of the circuits 52 through 56 with a power supply voltage necessary.

Note that examples of the configuration of the liquid crystal display device 50 are not limited to the one described above, but encompass (i) a configuration in which the function of the sensor scanning signal line drive circuit 54 or the sensor readout circuit 55 is incorporated in another circuit such as the display scanning signal line drive circuit 52 or the display video signal line drive circuit 53 and (ii) a configuration in which the function of the sensor readout circuit 55 is incorporated in the sensing image processing section 56.

(Protection Circuit and Pixel Circuit)

FIG. 7 is a circuit diagram illustrating a configuration of protection circuits 60 and of pixel circuits, both of which are built in a region Sb illustrated in FIG. 6.

The circuit board 1 may be configured such that protection circuits are provided for respective wires connecting the display panel 51 to the respective circuits (the display scanning signal line drive circuit 52, the display video signal line drive circuit 53, the sensor scanning signal line drive circuit 54, and the sensor readout circuit 55).

Note that the optical sensor circuits 40 are not illustrated in FIG. 7.

The circuit board 1 includes the protection circuits 60 that (i) protect, in the circuit board, the oxide TFTs 10 (10a, 10b) (first transistor elements) which are a part of a plurality of transistor elements provided on the insulating substrate and (ii) include respective diodes 61 (second transistor elements) which are the other part of the plurality of transistor elements. The diodes 61 are each configured by an a-SiTFT.

In other words, a-SiTFTs are used for elements (e.g. protection elements) requiring high electrical resistivity, and oxide semiconductors are used for elements that preferably have low electrical resistivity (high electron mobility).

More specifically, the protection circuits 60 are each (i) configured as a bidirectional diode in which two diodes 61 whose respective forward directions are opposite to each other are connected in parallel and (ii) provided for each of all the gate wires M2-n (see FIG. 7). Such a protection circuit 60 is also called a diode short ring. One end part of each protection circuit 60 is connected to a gate wire Gn (corresponding to each of the gate wires M2-n) corresponding thereto, and the other end part is connected to, for example, a grounding wire.

With the configuration, it is possible to swiftly provide an electrical discharging path between a gate wire M2-n and a grounding wire even in a case where an excessive voltage generated by static electricity or the like is applied to the gate wire M2-n. This makes it possible (i) to protect, from excessive voltage, thin-film transistors and the like which configure pixel circuits. Moreover, it is also made possible that the bidirectional diodes manage excessive bipolar (positive and negative) voltage.

Figure 8:
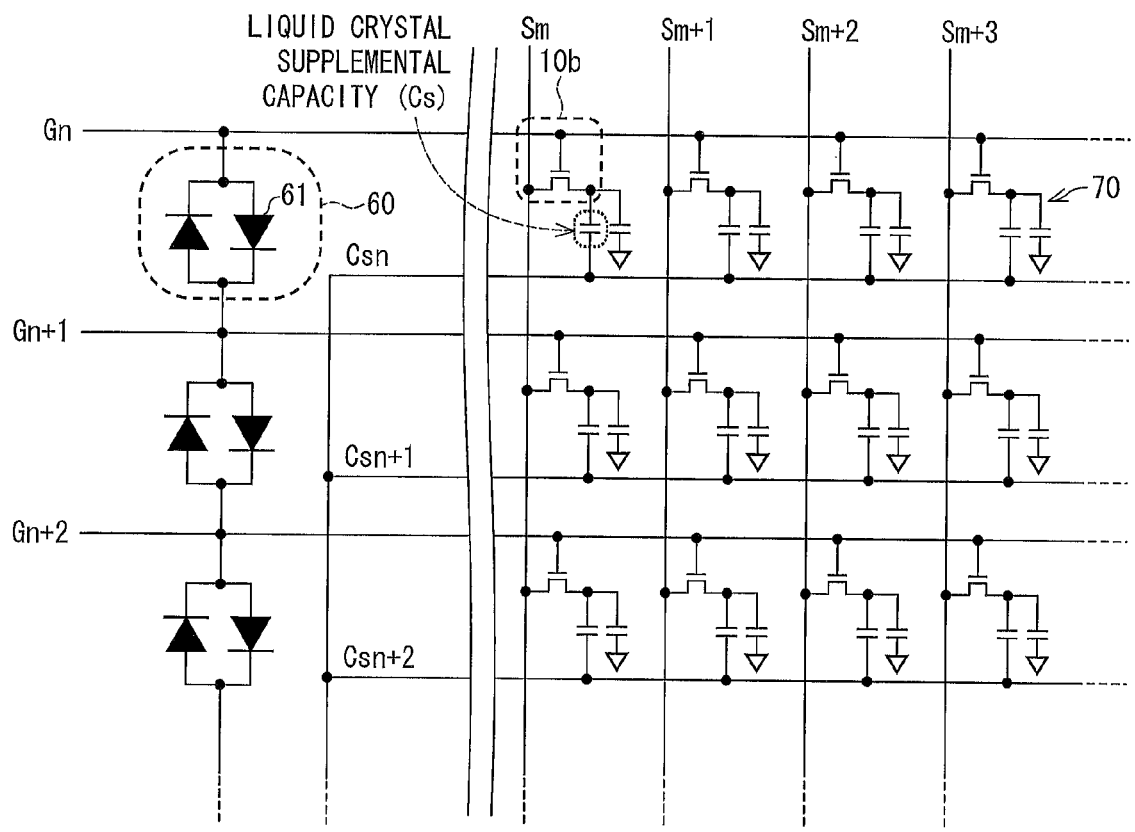
FIG. 8 is a circuit diagram illustrating other circuit configurations of the protection circuits.

Furthermore, as illustrated in FIG. 8, it is also possible to provide each of the protection circuits 60 so as to connect adjacent gate wires M2-n and M2-n+1. In such a case, it is possible to disperse, to other gate wires, a voltage excessively applied to the single gate wire M2-n. This makes it possible to likewise protect pixel circuits, such as oxide TFTs 10a, which are provided on the pixels 30.

(Significance of Designating a-SiTFTs as TFTs of Protection Circuits)

The TFTs serving as the diodes 61 of the protection circuits 60 are thus configured by a-SiTFTs. This reduces the area occupied by the protection circuits 60, and is therefore effective in decreasing the frame size of the display panel 51.

Oxide TFTs are characterized by having on-resistances smaller than those of a-SiTFTs by one digit. This causes a threshold voltage, at which oxide TFTs are turned on, to be lower than a threshold voltage at which a-SiTFTs are turned on. Therefore, (i) in a case where oxide TFTs are used for the protection circuits 60 of FIG. 7, there is a risk that electric currents might become leaked between gate wires M2-n and corresponding grounding wires and (ii) in a case where oxide TFTs are used for the protection circuits 60 of FIG. 8, there is a risk that electric currents might become leaked between adjacent gate wires.

Accordingly, in a case where an oxide TFT is used as the diode 61 of each of the protection circuits 60, it is necessary to increase a channel length (L) of the oxide TFT (see FIG. 10 to be described later), and therefore to increase the on-resistance of the oxide TFT. This causes the oxide TFT to inevitably become large in size, thereby hindering a reduction in a frame size of the display panel 51.

Note that, in a case where the protection circuits 60 are not provided in order to preferentially have a smaller frame size of the display panel 51, insulation breakdown etc. occur in the pixel circuits in a pixel 30. This reduces a yield in the production of the display panel 51.

The most appropriate thin-film transistors are thus selected according to their respective functions on an insulating substrate. This makes it possible to maximize the performance of a circuit board.

Specifically, in Embodiment 1, oxide TFTs are used for transistor elements for performing primary operations, examples of which transistor elements include (i) the switching elements of the respective pixels of the liquid crystal display device and (ii) the transistor elements included in the display scanning signal line drive circuit 52 and the display video signal line drive circuit 53 which are monolithically provided on the same insulating substrate on which each of the switching elements is provided. Therefore, it is possible to increase the responsiveness and the driving performance of the liquid crystal display device.

Also, an a-SiTFT is used for each of the transistor elements configuring the protection circuits 60. This allows for a reduction in the frame size of the display panel 51, thereby contributing to downsizing of the display device.

Therefore, it is possible to provide a circuit board and a display device each equipped with a small-sized high-performance electrical circuit.

Note that the protection circuits 60 can be each provided on a source wire M1-m as disclosed in Patent Literature 3, and their configurations are not limited to those illustrated in FIGS. 7 and 8.

(Plan-View Configuration of Bidirectional Diode)

Figure 9:
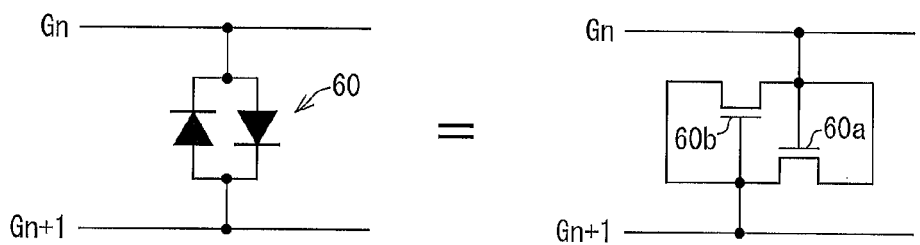
FIG. 9 is a circuit diagram illustrating, by use of TFT symbols, a bidirectional diode configuring the protection circuit.

FIG. 9 is a circuit diagram illustrating, by use of TFT symbols, a bidirectional diode configuring one of the protection circuits 60. As illustrated in FIG. 9, a TFT 60a and a TFT 60b are configured such that drains and gates are short-circuited. Specifically, (i) a gate of the TFT 60a is connected to a gate wire Gn (corresponding to a gate wire M2-n described above), (ii) a gate of the TFT 60b is connected to a gate wire Gn+1 (corresponding to a gate wire M2-n+1 described above) which is adjacent to the gate wire Gn, and (iii) the respective drains are connected to the respective gates of the other TFT.

Figure 10:
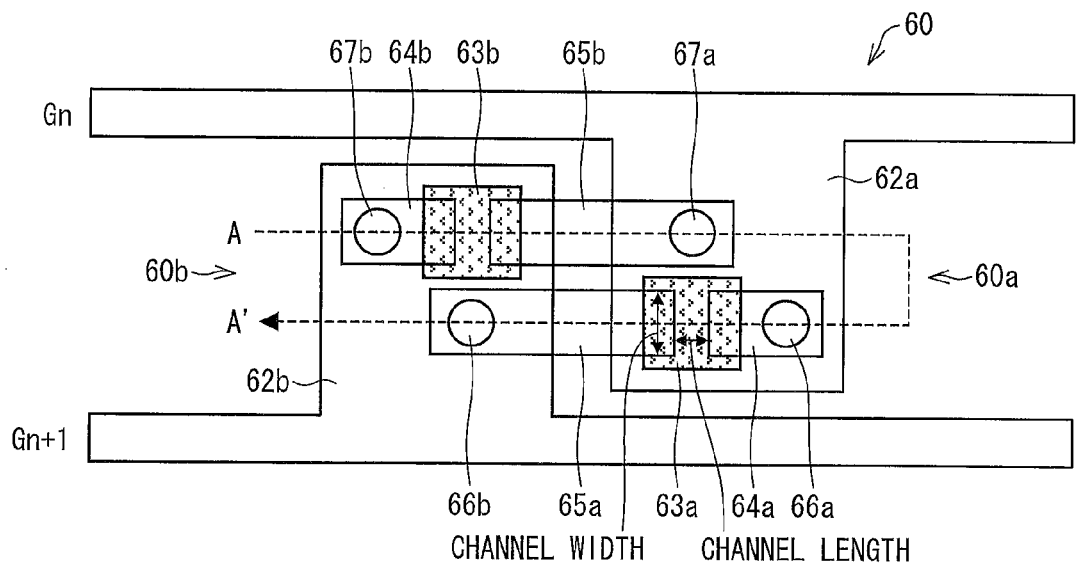
FIG. 10 is a plan view schematically illustrating the protection circuit and TFTs.

FIG. 10 is a plan view schematically illustrating the protection circuit 60 and the TFTs. As illustrated in FIG. 10, the TFT 60a is configured such that (i) a gate electrode 62a is extended from the gate wire Gn toward the gate wire Gn+1 and (ii) a channel layer 63a (a-SiTFT semiconductor) is provided on a part of the gate electrode 62a, which part is toward an end part of the protrusion, and (iii) a source electrode 64a and a drain electrode 65a face each other with a space in between on the channel layer 63a.

The source electrode 64a is connected to the gate electrode 62a via a contact hole 66a. The drain electrode 65a is connected to a gate electrode 62b of the TFT 60b via a contact hole 66b.

The TFT 60b is likewise configured such that (i) a gate electrode 62b is extended from the gate wire Gn+1 toward the gate wire Gn, (ii) a channel layer 63b (a-SiTFT semiconductor) is provided on a part of the gate electrode 62b, which part is toward an end part of the protrusion, and (iii) a source electrode 64a and a drain electrode 65b face each other with a space in between on the channel layer 63b.

The source electrode 64b is connected to the gate electrode 62b via a contact hole 67b. The drain electrode 65b is connected to the gate electrode 62a of the TFT 60a via a contact hole 67a.

The channel layer 63a and the channel layer 63b are each configured by an a-SiTFT semiconductor. This makes it possible to obtain a necessary on-resistance by configuring a channel length (L) to be shorter than a channel length of an oxide TFT without adapting a channel width (W) for a channel width of the oxide TFT.

(Cross-Sectional Configuration of Bidirectional Diode)

Figure 11:
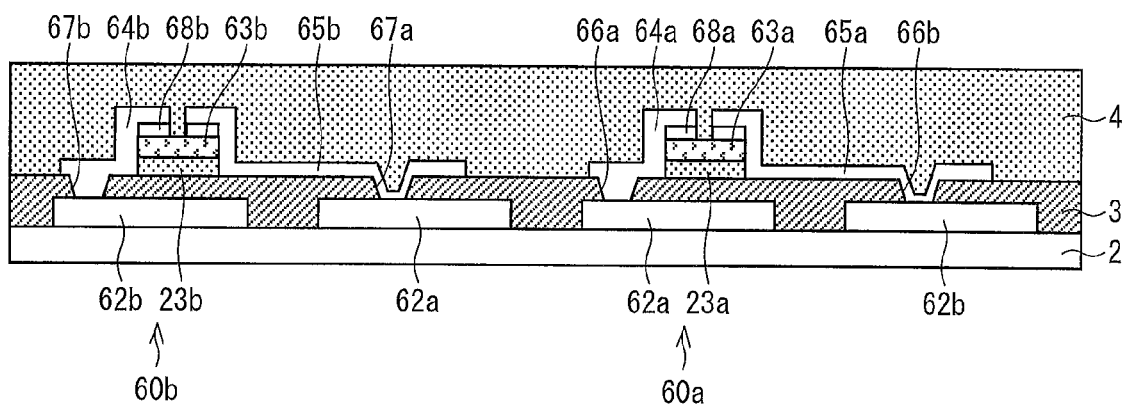
FIG. 11 is a cross-sectional view, taken along the line A-A' of FIG. 10, which schematically illustrates the protection circuit.

FIG. 11 is a cross-sectional view taken along the line A-A' illustrated in FIG. 10, which cross-sectional view schematically illustrates the protection circuit 60. As illustrated in FIG. 11, the TFTs 60a and 60b are provided on an insulating substrate 2, and are covered with and protected by a passivation film 4.

In each of the TFTs 60a and 60b, the gate electrodes 62a and 62b are provided on the insulating substrate 2, and are covered with a first gate insulating film 3. On the first gate insulating film 3, second gate insulating films 23a and 23b, each of which corresponds to the second gate insulating film 23, are provided above the gate electrodes 62a and 62b respectively.

Furthermore, the channel layers 63a and 63b (a-SiTFT semiconductors) are stacked on the second gate insulating films 23a and 23b respectively. Conductive layers 68a and 68b, each of which has a gap therein, are stacked on the channel layers 63a and 63b respectively. The source electrode 64a and the drain electrode 65a are provided on the conductive layer 68a so as to face each other with the space in between. The source electrode 64a and the drain electrode 65b are provided on the conductive layer 68b so as to face each other with the space in between.

The drain electrode 65a extends out onto the gate electrode 62b of the TFT 60b, and is connected to the gate electrode 62b via the contact hole 66b.

The source electrode 64a is connected to the gate electrode 62a of its own via the contact hole 66a.

On the other hand, the drain electrode 65b extends out onto the gate electrode 62a of the TFT 60a, and is connected to the gate electrode 62a via the contact hole 66b.

The source electrode 64b is connected to the gate electrode 62b of its own via the contact hole 66a.

Embodiment 2

Figure 12:
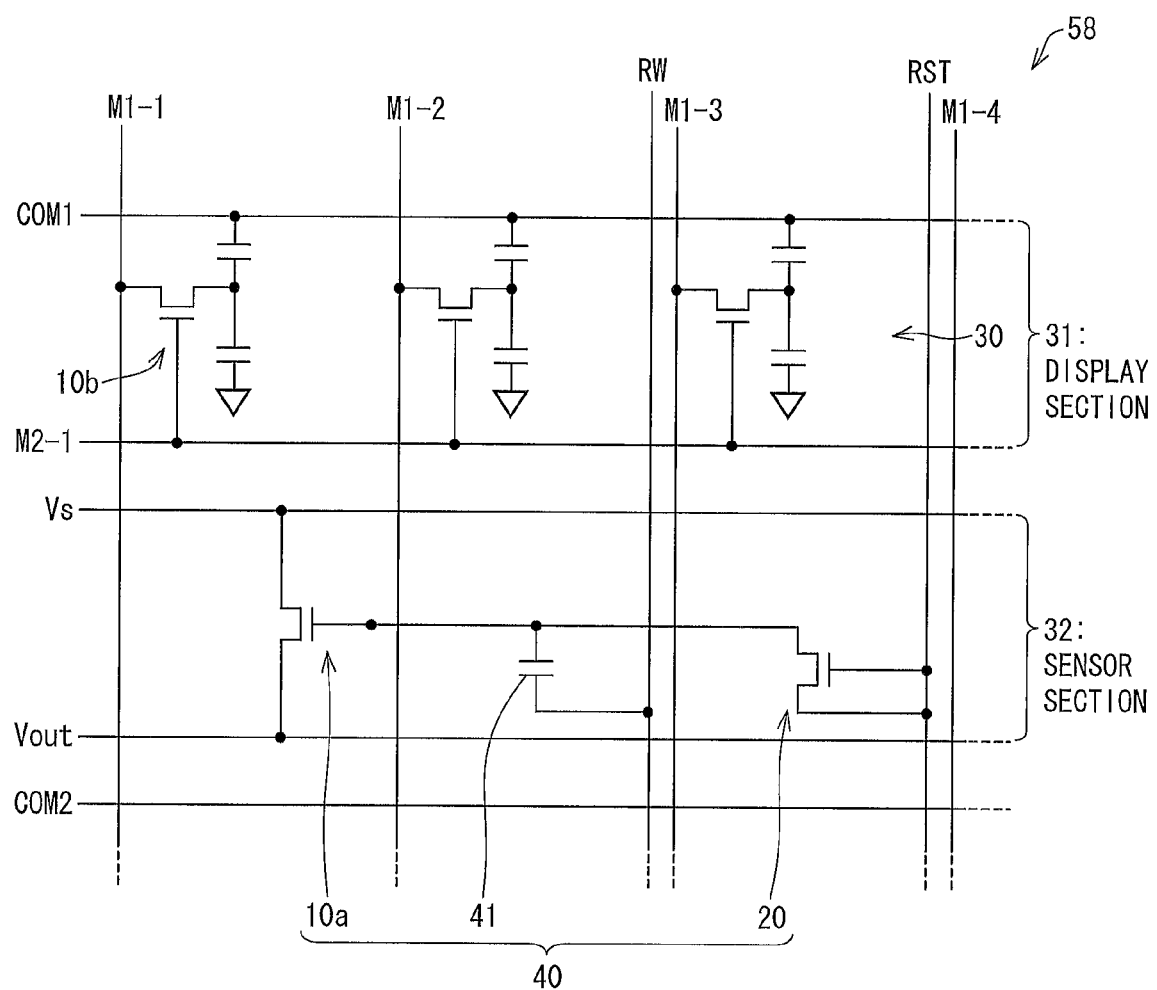
FIG. 12 is a circuit diagram illustrating a configuration of a liquid crystal display device including an optical sensor circuit.

The following description will discuss Embodiment 2 of the present invention with reference to FIG. 12.

FIG. 12 is a circuit diagram illustrating a configuration of a liquid crystal display device 58 including an optical sensor circuit.

The liquid crystal display device 58 and the liquid crystal display device 50 differ from each other in respective scanning directions of their respective optical sensor circuits 40.

According to the liquid crystal display device 50 in Embodiment 1, (i) the optical sensor line selecting wire RW and the photodiode resetting wire RST are each arranged in parallel to the gate wires M2-n and (ii) the AMP power supply bus line Vs and the optical sensor output bus line Vout are arranged in parallel to the source wires M1-m.

On the other hand, according to the liquid crystal display device 58, (i) an AMP power supply bus line Vs and an optical sensor output bus line Vout are each arranged in parallel to gate wires M2-n and (ii) an optical sensor line selecting wire RW and a photodiode resetting wire RST are each arranged in parallel to source wires M1-m.

According to the liquid crystal display device 58, (i) pixels 30, when displaying images, scan from a top to a bottom in a vertical direction of FIG. 12 and (ii) the optical sensor circuit optical sensor circuit 40, when sensing images, scans from left to right in a horizontal direction of FIG. 12. That is, the scanning directions of the pixels 30 for displaying images and the scanning directions of the optical sensor circuit 40 for sensing images differ from each other.

It is thus possible to configure the liquid crystal display device 58 to produce the same effects as those of the liquid crystal display device 50.

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention.

A circuit board of the present invention thus includes a plurality of transistor elements on an insulating substrate, at least one of the plurality of transistor elements being a first thin-film transistor element including, as a channel layer, a semiconductor which has a relatively large mobility and a relatively low sensitivity to light, at least one of the others of the plurality of transistor elements being a second thin-film transistor element (i) being different from the first thin-film transistor element in terms of functions as circuit components, (ii) including, as a channel layer, a semiconductor which has a relatively small mobility and a relatively high sensitivity to light, and the first thin-film transistor element being a top gate transistor, and the second thin-film transistor element being a bottom gate transistor.

With the configuration, in which the first thin-film transistor elements include, as the channel layers, the semiconductors each having relatively large mobility, the first thin-film transistor elements can produce high output voltage without being large in size. Therefore, the first thin-film transistor elements each have a first characteristic of capable of alleviating a reduction in aperture ratios of pixels while having low sensitivity to light. Additionally, with the configuration, the second thin-film transistor elements each have a second characteristic of having high sensitivity to light while generating a low output voltage due to their low mobility.

That is, the thin-film transistor elements each having the first characteristic and the thin-film transistor elements each having the second characteristic can serve different functions as circuit components. Therefore, with the configuration, it is possible to obtain a high-performance circuit board equipped with an electric circuit taking advantage of each of the different functions.

According to the configuration, (i) the first thin-film transistor elements are top gate transistors and (ii) the second thin-film transistor elements are bottom gate transistors. This makes it possible to provide, on a layer, (a) drain electrodes of the second thin-film transistor elements, (b) source electrodes of the second thin-film transistor elements, and (c) gate electrodes of the first thin-film transistor elements.

Hence, it is possible to configure, without providing contact holes, an electric circuit in which output electrodes of the second thin-film transistor elements are connected to the gate electrodes of the first thin-film transistor elements. This makes it possible to configure, for example, the electric circuit such that driving of the first thin-film transistor elements is controlled according to outputs from the electrodes of the second thin-film transistor elements without providing contact holes.

Therefore, it is possible to (i) simplify the process of producing such an electric circuit and (ii) reduce areas of regions necessary for providing contact holes. This makes it possible to reduce the area of regions necessary for mounting of the electric circuit, and therefore to further limit a reduction in aperture ratios of pixels.

It is preferable to configure the circuit board of the present invention such that: the first thin-film transistor element and the second thin-film transistor element are incorporated to configure an optical sensor circuit; the first thin-film transistor element plays a role of a sensor output of the optical sensor circuit; and the second thin-film transistor element plays a role of an optical sensor element of the optical sensor circuit.

According to the configuration, the first thin-film transistor elements includes, as channel layers, semiconductors having relatively large mobility. Such first thin-film transistor elements each have the first characteristic of (i) being capable of producing a high output voltage while alleviating a reduction in aperture ratios of pixels and (ii) having low sensitivity to light. This makes each of the first thin-film transistor elements suitable for a sensor output of an optical sensor circuit.

On the other hand, the second thin-film transistor elements include, as channel layers, semiconductors having relatively high sensitivity to light. Such second thin-film transistor elements each have the second characteristic of having high sensitivity to light while generating a low output voltage due to its low mobility. This makes each of the second thin-film transistor elements suitable for an optical sensor element of an optical sensor circuit.

Hence, with the first thin-film transistor elements and the second thin-film transistor elements, it is possible to configure an optical sensor circuit having such advantages as (i) suppression of a reduction in aperture ratios of pixels, (ii) high sensitivity to light, and (iii) fast response speed.

In addition, such advantages of the optical sensor circuit are extremely advantageous in a case where, for example, a liquid crystal display device having a touch panel function or an image scanning function is configured by mounting a plurality of the optical sensor circuits in an active matrix substrate on which pixels using liquid crystals are arranged in matrix format.

It is preferable to configure the circuit board of the present invention such that an identical conductive layer forms a gate electrode of the first thin-film transistor element and a drain electrode of the second thin-film transistor element.

With the configuration, it is possible to connect, without providing contact holes, (i) the gate electrodes of the first thin-film transistor elements and (ii) the drain electrodes of the second thin-film transistor elements. This makes it possible to reduce the area of regions necessary for providing contact holes, and therefore to alleviate a reduction in aperture ratios of pixels.

It is preferable to configure the circuit board of the present invention such that the gate electrode of the first thin-film transistor element and the drain electrode of the second thin-film transistor element are connected to each other through wiring.

With the configuration, it is possible to drive the first thin-film transistor elements according to outputs from the drain electrodes of the second thin-film transistor elements.

It is preferable to configure the circuit board of the present invention such that: the channel layer included in the first thin-film transistor element is made from an oxide semiconductor; and the channel layer included in the second thin-film transistor element is made from an amorphous silicon semiconductor.

With the configuration, it is possible to configure (i) the first thin-film transistor elements each having the first characteristic and (ii) the second thin-film transistor elements each having the second characteristic.

The circuit board of the present invention is configured such that: a gate insulating film whose main component is $SiO_2$ is sandwiched between the channel layer of and the gate electrode of the first thin-film transistor element; a gate insulating film whose main component is $SiN_x$ and a gate insulating film whose main component is $SiO_2$ are (i) stacked together in this order from a channel-layer side and (ii) sandwiched between the channel layer of and a gate electrode of the second thin-film transistor element; and the gate insulating films, whose main component is $SiO_2$, of the first thin-film transistor element and of the second thin-film transistor element are provided as a layer.

With the configuration, it is possible that (i) the oxide semiconductors configuring the channel layers of the first thin-film transistor elements are in contact with gate insulating film suitable for the oxide semiconductors and (ii) the amorphous silicon semiconductors configuring the channel layers of the second thin-film transistor elements are in contact with the gate insulating film suitable for the amorphous silicon semiconductors.

That is, in a case where an oxide semiconductor comes into contact with a chemically reducing material, the oxide semiconductor is chemically reduced, thereby being deteriorated in its properties. With the configuration, however, the oxide semiconductors are in contact with oxide. Therefore, it is possible to prevent the deterioration of the properties of the semiconductors.

In a case where an amorphous silicon semiconductor comes into contact with an oxide, the amorphous silicon semiconductor is oxidized, thereby being deteriorated in its properties. With the configuration, however, the amorphous silicon semiconductors are in contact with the chemically reducing material. Therefore, it is possible to prevent the deterioration of the properties of the amorphous silicon semiconductors.

In addition, since the $SiO_2$ layers of the first thin-film transistor element and of the second thin-film transistor element are provided as a layer, it is also possible to achieve (i) the simplification of a production process and (ii) a reduction in production costs.

It is preferable that the circuit board further includes a protection circuit for providing circuitry protection for protecting a first transistor element which is one of the plurality of transistor elements, the protection circuit including a second transistor element which is one of the plurality of transistor elements, the first transistor element is the first thin-film transistor element, and the second transistor element is the second thin-film transistor element.

According to the configuration, the second thin-film transistor elements including, as the channel layers, the amorphous silicon semiconductors are designated as the second transistor elements configuring the protection circuits. This makes it possible to decrease the area occupied by the protection circuits, as compared with a case where the first thin-film transistor elements including, as the channel layers, the oxide semiconductors are designated as the second transistor elements.

Furthermore, the first thin-film transistor elements are designated as the first transistor elements to be protected in the circuit board. This makes it possible to increase the responsiveness and the driving performance of transistor elements for performing primary operations, examples of which transistor elements include (i) switching elements of respective pixels of a liquid crystal display device and (ii) transistor elements included in a drive circuit monolithically provided on the same insulating substrate on which each of the switching elements is provided.

Since the transistors elements suitable for their respective functions in the circuit board are thus mounted on the insulating substrate, it is possible to provide a circuit board equipped with a small-sized high-performance electric circuit.

A display panel in accordance with the present invention includes any one of the circuit boards described above. With the configuration, it is possible to provide a display panel having the advantages of the respective circuit boards described above.

A display device in accordance with the present invention includes any one of the circuit boards described above. With the configuration, it is possible to provide a display device having the advantages of the respective circuit boards described above.

A method of the present invention for producing a circuit board is for producing a circuit board in which a first thin-film transistor element and a second thin-film transistor element, which differ from each other in their respective functions as circuit components, are provided on an insulating substrate, the respective functions being different due to use of different types of semiconductors from which respective channel layers of the first thin-film transistor element and the second semiconductor transistor element are formed, said method comprising the steps of: forming an insulating film on both the channel layer of the first thin-film transistor element and a gate electrode of the second semiconductor transistor element, which are patterned on the insulating substrate; and patterning an identical conductive layer on the insulating film into (i) a gate electrode of the first thin-film transistor element, (ii) a source electrode of the second thin-film transistor element, and (iii) a drain electrode of the second thin-film transistor element.

With the configuration, it is possible (as already described in the sections above regarding the invention of the circuit board) to reduce the area of regions necessary for installation of the electric circuit so that a reduction in aperture ratios of pixels can be alleviated. This makes it possible to inexpensively produce a high-performance circuit board.

INDUSTRIAL APPLICABILITY

The present invention is applicable to (i) a signal distributor in which a signal outputted from a first circuit is time-divisionally supplied to a latter circuit via a plurality of feeder lines and (ii) an electronic device such as a display device using such a signal distributor.

REFERENCE SIGNS LIST 1, 1a, 1 Circuit board
2 Insulating substrate
3, 3B Gate insulating film
10 Oxide TFT (first thin-film transistor element)
10a, 10b, 10c, 10d Oxide TFT (first thin-film transistor element)
11, 21 Channel layer
12, 12a, 12b, 22 Gate electrode
15, 15a, 15b, 25 Source electrode
16, 16a, 16b, 26 Drain electrode
20, 20a, 20b a-SiTFT (second thin-film transistor element)
23, 23a, 23b, 23B Gate insulating film
24 Conductive layer
27, 42 Contact hole
30 Pixel
40 Optical sensor circuit
41 Boost capacitor
41a, 41b Terminal
50, 58 Liquid crystal display device (display device)
60 Protection Circuit
60a, 60b TFT (second transistor element)
61 Diode

The invention claimed is:

1. A circuit board of a display device comprising:
a plurality of transistor elements on an insulating substrate, the plurality of transistor elements including:
a first type of the plurality of transistor elements including a first channel layer which is made of a first semiconductor material and arranged in a first area of the insulating substrate; and
a second type of the plurality of transistor elements including a second channel layer which is made of a second semiconductor material which is different from the first semiconductor material and being arranged in a second area of the insulating substrate which is outside of the first area; wherein the first area of the insulating substrate is a display area of the display device and the second area of the insulating substrate includes a protection circuit of the display device, and the first semiconductor material is an oxide semiconductor having a first electrical resistivity, and the second semiconductor material has a second electrical resistivity which is higher than the first electrical resistivity, the second type of the plurality of transistor elements are diodes, pairs of the diodes are arranged to define diode short rings, the pairs of the diodes include a first diode and a second diode, the first diode defined by the second type of the plurality of transistor elements includes a first gate electrode, a first source electrode and a first drain electrode wherein the first source electrode is electrically connected to the first gate electrode, the second diode defined by the second type of the plurality of transistor elements includes a second gate electrode, a second source electrode and a second drain electrode wherein the second source electrode is electrically connected to the second gate electrode, and the first drain electrode vertically overlaps the second gate electrode in a single layer, and the second drain electrode vertically overlaps the first gate electrode in a single layer.

2. The circuit board as set forth in claim 1, wherein:
the first type of the plurality of transistor elements are switching elements configured to drive a pixel provided in the display area.

3. The circuit board as set forth in claim 1, wherein the protection circuit is configured to provide circuitry protection which protects the first type of the plurality of transistor elements from excess voltage.

4. The circuit board as set forth in claim 3, wherein the protection circuit is configured to protect the first type of the plurality of transistor elements from excess voltage by providing an electrical discharging path between a gate wire and a grounding wire.

5. The circuit board as set forth in claim 3, wherein the protection circuit is configured to protect the first type of the plurality of transistor elements from excess voltage by providing an electrical discharging path between a gate wire and an adjacent gate wire.

6. The circuit board as set forth in claim 1, wherein the oxide semiconductor material is In—Ga—Zn—O (IGZO).

7. The circuit board as set forth in claim 1, wherein the first type of the plurality of transistor elements is a top gate thin film transistor.

8. The circuit board as set forth in claim 1, wherein the first type of the plurality of transistor elements is a bottom gate thin film transistor.

9. A display panel comprising the circuit board as set forth in claim 1.

* * * * *